US011341317B2

(12) United States Patent
Liu et al.

(10) Patent No.: US 11,341,317 B2
(45) Date of Patent: May 24, 2022

(54) SUPPORTING PIECEWISE UPDATE OF JSON DOCUMENT EFFICIENTLY

(71) Applicant: Oracle International Corporation, Redwood Shores, CA (US)

(72) Inventors: Zhen Hua Liu, San Mateo, CA (US); Beda Christoph Hammerschmidt, Los Gatos, CA (US); Douglas James Mcmahon, Redwood City, CA (US); Joshua Jeffrey Spiegel, St. Louis, MO (US)

(73) Assignee: Oracle International Corporation, Redwood Shores, CA (US)

( * ) Notice: Subject to any disclaimer, the term of this patent is extended or adjusted under 35 U.S.C. 154(b) by 19 days.

(21) Appl. No.: 16/863,268

(22) Filed: Apr. 30, 2020

(65) Prior Publication Data

US 2021/0117611 A1 Apr. 22, 2021

Related U.S. Application Data

(60) Provisional application No. 62/916,154, filed on Oct. 16, 2019.

(51) Int. Cl.
*G06F 40/146* (2020.01)
*G06F 16/22* (2019.01)
*G06F 16/23* (2019.01)

(52) U.S. Cl.
CPC ........ *G06F 40/146* (2020.01); *G06F 16/2282* (2019.01); *G06F 16/2358* (2019.01)

(58) Field of Classification Search
None
See application file for complete search history.

(56) References Cited

U.S. PATENT DOCUMENTS

| 8,805,849 | B1* | 8/2014 | Christensen | G06F 16/20 |
| | | | | 707/741 |
| 11,144,513 | B1* | 10/2021 | Padisetty | G06F 16/185 |
| 2012/0174075 | A1* | 7/2012 | Carteri | G06F 11/3688 |
| | | | | 717/127 |
| 2017/0141791 | A1* | 5/2017 | Balegar | H03M 7/60 |

(Continued)

OTHER PUBLICATIONS

P. Hoffman et al., "JSON Merge Patch", Internet Engineering Task Force (IETF), dated Oct. 2014, 9 pages.

(Continued)

*Primary Examiner* — Howard Cortes
(74) *Attorney, Agent, or Firm* — Hickman Becker Bingham Ledesma LLP; Brian N. Miller

(57) ABSTRACT

Herein are fine grained updates to pieces of JavaScript object notation (JSON) documents by database statements that can update, delete, and insert parts of JSON documents. In an embodiment, a computer receives a request that specifies a modification of a JSON document that is stored in a compressed format in persistent storage. The modification adds additional content to the JSON document, and/or replaces an old value in the JSON document with a new value that is not a same size as the old value. The modification is recorded in a change log. The change log is eventually applied to the compressed format of the JSON document in the persistent storage without entirely rewriting the compressed format of the JSON document in the persistent storage.

37 Claims, 7 Drawing Sheets

(56) References Cited

U.S. PATENT DOCUMENTS

2019/0306237 A1* 10/2019 Srinivasan .............. G06F 16/83
2019/0340278 A1* 11/2019 Bensberg ................. G06F 7/08
2019/0361916 A1   11/2019 Weaver
2019/0384841 A1* 12/2019 Geissinger .......... G06F 16/2379

OTHER PUBLICATIONS

Odie's Oracle Blog, "JSON Patch, Merge Patch, and Redact features in Oracle 18c", dated Aug. 27, 2018, 16 pages.

Liu et al., "Closing the functional and Performance Gap between SQL and NoSQL", SIGMOD'16, Jun. 26-Jul. 1, 2016, San Francisco, California, USA, 12 pages.

ISO/IEC TR, 19075-6, Information technology—Database languages—SQL Technical Reports, "Part 6: SQL support for JavaScript Object Notation (JSON)", First Edition dated Mar. 2017, 112 pages.

Idalko, Tools for Aglie Teams, "CRUD operations with Postgres JSONB", dated May 31, 2017, 18 pages.

Hatlen, Knut, "Partial update of JSON values", dated Apr. 3, 2018, https://mysqlserverteam.com/partial-update-of-json-values/, 6 pages.

Liu, Zhen Hua, "JSON Data Management in RDBMS", https://www.igi-global.com/chapter/json-data-management-in-rdbms/230682, DOI: 10.4018/978-1-5225-8446-9.ch002, dated 2019, 27 pages.

Hatlen, Knut, "Partial Update of JSON Values", MySQL Server Blog, https://dev.mysql.com/blog-archive/partial-update-of-json-values/, dated Apr. 2018, 6 pages.

Hammerschmidt, Beda, "The new SQL/JSON Query operators (Part5: JSON_TABLE, Nested Path, Ordinality Column)", JSON in the Oracle Database, dated May 18, 2015, 7 pages.

Bryan et al., "JavaScript Object Notation (JSON) Patch", https://www.hjp.at/doc/rfc/rfc6902.html, dated Apr. 2013, 18 pages.

Liu et al., "JSON Data Management—Supporting Schema-less Development in RDBMS", InfoComp 2012: The Second International Conference on Advanced Communications and Computation, http://dx.doi.org/10.1145/2588555.2595628, dated Jan. 2014, 12 pages.

* cited by examiner

SUPPORTING PIECEWISE UPDATE OF JSON DOCUMENT EFFICIENTLY

BENEFIT CLAIM AND RELATED CASES

This application claims the benefit under 35 U.S.C. § 119(e) of Provisional Application No. 62/916,154, filed Oct. 16, 2019, the entire contents of which is hereby incorporated by reference as if fully set forth herein. Incorporated by reference herein in their entirety are the following related cases:

U.S. Pat. No. 10,262,012 "TECHNIQUES RELATED TO BINARY ENCODING OF HIERARCHICAL DATA OBJECTS TO SUPPORT EFFICIENT PATH NAVIGATION OF THE HIERARCHICAL DATA OBJECTS" filed on Aug. 26, 2015 by Zhen Hua Liu et al;

U.S. patent application Ser. No. 16/904,417 "TECHNIQUE OF EFFICIENTLY, COMPREHENSIVELY AND AUTONOMOUSLY SUPPORT NATIVE JSON DATATYPE IN RDBMS FOR BOTH OLTP & OLAP" filed on Jun. 17, 2020 by Zhen Hua Liu et al; and U.S. patent application Ser. No. 16/703,499 "INFERRING INTRA PACKAGE AND MODULE DEPENDENCIES" filed on Dec. 4, 2019 by Pit Fender et al.

The following non-patent literature (NPL) is related and incorporated herein by reference in its entirety:

Information technology—Database languages—SQL Technical Reports—Part 6: SQL support for JavaScript Object Notation (JSON), Technical Report ISO/IEC TR 19075-6, First edition, March 2017.

FIELD OF THE DISCLOSURE

The present disclosure relates to modification of a JavaScript object notation (JSON) document that is stored in a compressed format in persistent storage. Techniques herein accelerate modification of the compressed format of the JSON document in the persistent storage by avoiding entirely rewriting the compressed format of the JSON document in the persistent storage.

BACKGROUND

Being a lean semi-structured data format, JavaScript object notation (JSON) is popular for supporting schema-less agile style application development with JSON documents stored in a structured query language (SQL) based relational database management system (RDBMS) and/or No-SQL style Document Object Store. In such a data application model, a JSON object becomes a unit for document retrieval, query and update to support online transaction processing (OLTP) for micro services. However, when compared to updates in a relational model where a single update granularity can be at a per column level, a key-value No-SQL style store may have to update the JSON document as a whole even if only a single field of a JSON document needs to be updated functionally.

When a JSON document is stored as JSON text, there are not many optimizations that can be performed at the storage level other than performing full document replacement unless the required change is so trivial that the update engine can precisely match the JSON text parser character position with the required change. Such update optimization for JSON text storage is typically not attempted because such an interleaved JSON text parser and update engine requires much design effort and yet provides only minimal improvement because the exact text update size matching does not often occur.

One popular binary format in the industry is BSON from MongoDB. It can support limited partial updates when the new content can exactly fit within the original content (basically the same limitation that applies to JSON text). For example, replacing a scalar string value from 'ZHEN' to 'CHEN' can be performed via partial update because the old and new content fit exactly; yet, updating 'ZHEN' to 'ZHENG' cannot be performed via partial update. MySQL's binary JSON design has similar restrictions.

A file system implementation may be sophisticated enough to support deletion in the middle and insertion in the middle of a file that stores a JSON document, then binary partial update might somehow be feasible for encodings of JSON such as BSON. However, such a sophisticated file system implementation would have to internally support an additional bookkeeping layer that maps the logical byte offset in a file to its physical offset. This inevitably burdens the design of the file system with additional performance cost.

Users have little choice but to use a JSON document object model (DOM) application programing interface (API) to procedurally traverse and update a JSON document. While such piecewise updates work functionally, supporting them efficiently at a storage level is not adequately addressed. Implementations by typical vendors end up doing full JSON document replacement even though an update logically only requires performing a small change to a JSON document. This becomes a performance problem when the JSON document is moderately sized in megabytes or tens of kilobytes. Full JSON document update from a transaction logging perspective is particularly expensive because it requires a change log size proportional to the size of the full JSON document after updating. The change log affects not only the performance of data manipulation language (DML) but also affects replication performance and other features relying on the change log.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

DETAILED DESCRIPTION

Figure 1:
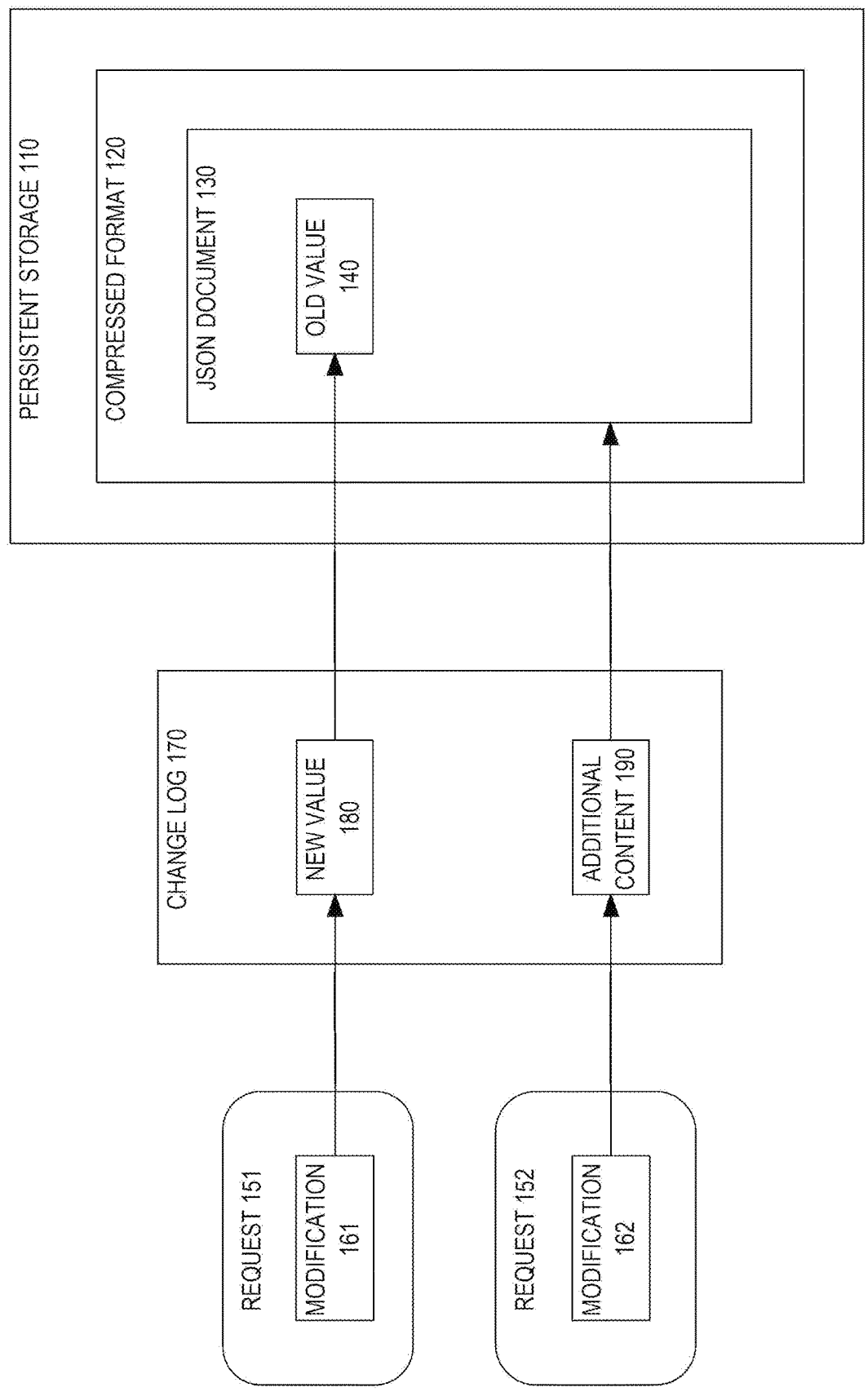
FIG. 1 is a block diagram that depicts an example computer that accelerates modification of a persistent JavaScript object notation (JSON) document by avoiding entirely rewriting the persistent JSON document.

In the following description, for the purposes of explanation, numerous specific details are set forth in order to provide a thorough understanding of the example embodiment(s) of the present disclosure. It will be apparent, however, that the example embodiment(s) may be practiced without these specific details. In other instances, well-known structures and devices are shown in block diagram form in order to avoid unnecessarily obscuring the example embodiment(s).

General Overview

Herein is a Document Object Store that provides fine grained updates to pieces of JavaScript object notation (JSON) document(s) via a declarative language application programing interface (API). Herein, a relational database management system (RDBMS) that persists JSON documents also provides piecewise updating of the JSON documents via structured query language (SQL) functions. Such SQL functions typically can update, delete, and insert parts of JSON documents via a SQL/JSON expression and path language in a declarative manner. There can be multiple such SQL functions, each of which does one kind of JSON update function. For example, JSON_MERGEPATCH( ) and JSON_TRANSFORM( ) are SQL invocable functions that are capable of performing a sequence of changes declaratively via one function invocation.

Using SQL functions to do piecewise JSON updates is more user friendly and ergonomic compared to requiring users to use a JSON document object model (DOM) API to procedurally traverse and update a JSON document. Realized herein is the ideal goal of change log size being proportional to the actual piecewise change of a JSON document. Accelerated access herein to a change log increases the performance of: a) data manipulation language (DML) operations, b) replication, and c) other features relying on the change log.

When a JSON document is persisted in a binary format, then there are great opportunities to perform piecewise update efficiently by designing an amendable binary format that balances the requirements of providing fast queries and enabling partial update within the binary format. Oracle's OSON binary format performs partial updates for many cases where new content does not exactly fit within original byte content of an OSON document. The approaches proposed herein are designed for the binary format like OSON to support many piece-wise updates at the physical level so that change log size is proportional to the actual required piecewise change of the JSON document. These approaches may detect cases that have a significant amount of changes (from accumulated changes in the past and changes from the execution of the current updating operations) required on OSON so that an OSON document autonomously reorganizes itself by generating a new and more compact document when appropriate. OSON design follows the logical concept that JSON is a tree model and thus provides native tree offset based jump navigation so that it can support partial update at physical OSON bytes level naturally as presented in related U.S. Pat. No. 10,262,012. Furthermore, in an embodiment the OSON partial update design herein requires only a standard file system like UNIX/POSIX file system API that is able to seek a particular offset within a file to do byte-length preserved content replacement or append bytes onto the end of a file for growth. The underlying file system need not have the capability of doing deletion of bytes in the middle of the file to cause holes or insert extra bytes in the middle of the file to cause file growth in the middle.

A significant technical difference from other solutions is that piecewise OSON updates herein are performed as much as possible without performing full document updates to reduce the transaction change log size and greatly improve update and replication performance. In typical cases, the number of OSON bytes being updated is proportional to the content to be functionally updated, not proportional to the whole document size. However, if an update is so complicated that it distorts the OSON bytes too much, then the OSON document autonomously performs a full document overwrite when appropriate. An OSON transactional subsystem of an RDBMS makes such decisions at runtime for each document based on the accumulated respective changes that have occurred in the past together with required changes needed to perform current update operations. Thus, an OSON document lifecycle may include autonomous compaction immediately or with intelligent scheduling.

When a document is small enough to be inlined in a binary large object (BLOB) within a row of a table in a relational database, then there might be little or no advantage of doing a physical partial update. In that case, the RDBMS may instead do full document replacement.

When a document is big, two BLOB APIs that are used are somewhat similar to standard UNIX/POSIX file system API: length preserved byte content replacement, or append byte onto the end. If an in place update fits, the RDBMS does BLOB length preserved replacement. If an in place update will no longer fit, a redirection tombstone overwrites the current location with a new forwarding address of the newly inserted pieces that is appended at the end of the BLOB.

Some operations, such as JSON array insertion, dynamically adapts the behavior of update with an exponential growth strategy that is used to reserve space to accommodate future in-place update requests. When accumulated appended new pieces exceed a threshold percent of the total OSON document size, the RDBMS compacts and entirely replaces the OSON document.

Since desired partial update semantics over various JSON constructs (JSON object/array member insertion, deletion, member value update, JSON scalar update) are already included in an RDBMS/OSON integration, OSON bytes can be designed properly to accommodate these piecewise update operations with controlled performance for query and update without requesting underlying storage APIs to do additional bookkeeping.

In an embodiment, a computer receives a request that specifies a modification of a JavaScript object notation (JSON) document that is stored in a compressed format in persistent storage. The modification adds additional content to the JSON document, and/or replaces an old value in the JSON document with a new value that is not a same size as the old value. The modification is recorded in a change log. The change log is eventually applied to the compressed format of the JSON document in the persistent storage without entirely rewriting the compressed format of the JSON document in the persistent storage.

1.0 Example Computer

FIG. 1 is a block diagram that depicts an example computer 100, in an embodiment. Computer 100 accelerates modification of JavaScript object notation (JSON) document 130 that is stored in compressed format 120 in persistent storage 110 by avoiding entirely rewriting compressed format 120 in the persistent storage 130. Computer 100 may be one or more of a rack server such as a blade, a personal computer, a mainframe, a virtual machine, or a smartphone.

Persistent storage 110 is a nonvolatile storage such as a magnetic disk, flash memory, or network attached storage (NAS). JSON document 130 contains semi-structured data such as scalars and aggregates such as arrays, objects that contain name/value pairs, and/or nesting such as an array or object within an array or object. For example, JSON document 130 contains old value 140 that may be a scalar or an aggregate value such as an array or an object. Herein an aggregate is a JSON array or a JSON object.

Compressed format 120 is a binary format that differs from a raw text encoding of JSON document 130. Compressed format 120 is a self-contained encoding of JSON document 130 that: a) is not, or not entirely, encoded as text characters, b) contains metadata that is based on, but not part of, text content of JSON document 130, and c) contains metadata for navigating and/or decompressing content of JSON document 130. In an embodiment, metadata (b) and (c) are a same metadata. In an embodiment, field and element names and values may be replaced with tokens that are each mapped to a value by a dictionary such as with dictionary encoding. The dictionary can be stored in compressed format 120 of JSON document 130 or stored elsewhere such as in a database or file so that a same dictionary may used to encode multiple JSON documents. In an embodiment, compressed format 120 is Oracle's OSON binary format for JSON. Techniques for implementing compressed format 120 are presented in related U.S. Pat. No. 10,262,012.

The lifecycle of compressed format 120 of JSON document 130 may include content mutation. For example, computer 100 may receive or generate requests such as 151-152 that specify respective modifications 161-162 to change what content is stored within JSON document 130. Depending on the embodiment, request 151 is expressed as data manipulation language (DML) such as a create read update delete (CRUD) statement or query by example (QBE). An autonomous lifecycle for compressed format 120 of JSON document 130 is presented later herein.

For example, request 151 may be a structured query language (SQL) DML statement such as an UPDATE. In an embodiment, request 151 is received through open database connectivity (ODBC). For example, computer 100 may host a database management system (DBMS) that stores JSON document 130 in a persistent database as discussed later herein. In an embodiment, request 151 is a hypertext transfer protocol (HTTP) request such as: GET, POST, common gateway interface (CGI), and/or representational state transfer (REST).

Modification 162 specifies that additional content 190 should be added to JSON document 130. Additional content 190 is a JSON value such as a scalar or an aggregate. Modification 162 may imply or expressly specify that additional content 190 should be appended or inserted into JSON document 130. For example, modification 162 may specify: a) an array within JSON document 130 that additional content 190 should be appended onto, b) an offset into that array at which to insert an additional array element, or c) a key (i.e. field name) for adding additional content 190 as a value in a JSON object.

Computer 100 need not directly and immediately apply modifications 161-162 to compressed format 120 of JSON document 130 in persistent storage 110. Instead, details of modifications 161-162, such as new value 180 and additional content 190 may be appended onto change log 170 for deferred application to compressed format 120 of JSON document 130 in persistent storage 110. Depending on the embodiment, change log 170 may be stored in volatile memory and/or persistent storage 110. Format and operation of change log 170 are discussed later herein.

In any case, change log 170 is eventually applied to compressed format 120 of JSON document 130 in persistent storage 110, including modifications 161-162. In an embodiment, request 151 and/or 152 may occur within a database transaction such as an atomic consistent isolated durable (ACID) transaction. In an embodiment, the transaction completes when details of modification 161 and/or 162 are recorded in change log 170. In an embodiment, the transaction instead completes when change log 170 is applied to compressed format 120 of JSON document 130 in persistent storage 110.

Thus depending on the embodiment, a request to commit the transaction may or may not cause change log 170 to be immediately applied to compressed format 120 of JSON document 130 in persistent storage 110. In a scenario in which request 151 does not occur, and change log 170 reflects only modification 162, then after applying change log 170, compressed format 120 of JSON document 130 in persistent storage 110 may contain both of old value 140 and additional content 190.

Modification 161 specifies a value reassignment that writes new value 180 into JSON document 130. New value 180 overwrites or otherwise replaces old value 140 within compressed format 120 of JSON document 130. For example, modification 161 may specify: a) an offset into an array within JSON document 130 at which to replace an existing array element with new value 180, or b) an existing key (i.e. field name) for a JSON object within JSON document 130 to be reassigned to new value 180. For example after fulfilling request 151 by applying change log 170: a) JSON document 130 logically contains new value 180 but not old value 140, and b) compressed format 120 contains new value 180 and may or may not still physically contain old value 140. In an example, requests 151-152 may be a same request that specifies both of new value 180 and additional content 190.

Other approaches may have awkward limitations that may be: a) unable to fulfil request 151 or 152, or b) unable to efficiently fulfil request 151 or 152. For example, other approaches may require that values 140 and 180 have a same size. Other approaches may fulfil request 151 or 152 by entirely rewriting compressed format 120 of JSON document 130 in persistent storage 110, which may waste input/output (I/O) bandwidth.

The nature of nonvolatile technology may degrade other approaches as follows. For example when compressed format 120 of JSON document 130 is large enough to need multiple seeks to write, then a disk may incur additional latencies for switching tracks and/or rotating. Likewise, writing flash memory is slower than reading flash memory. Other approaches may reduce life expectancy of flash memory that may permanently fail after too many writes to a same region in the flash memory.

Techniques herein avoid those technical problems by not entirely rewriting compressed format 120 of JSON document 130 in persistent storage 110 to fulfil request 151. For example, requests 151-152 may be fulfilled by overwriting or appending content onto compressed format 120 of JSON document 130 in persistent storage 110. Thus based on change log 170, computer 100 performs only partial updates to compressed format 120 of JSON document 130 in persistent storage 110 to fulfil requests 151-152.

2.0 Accelerated Modification without Rewriting JSON Document

Figure 2:
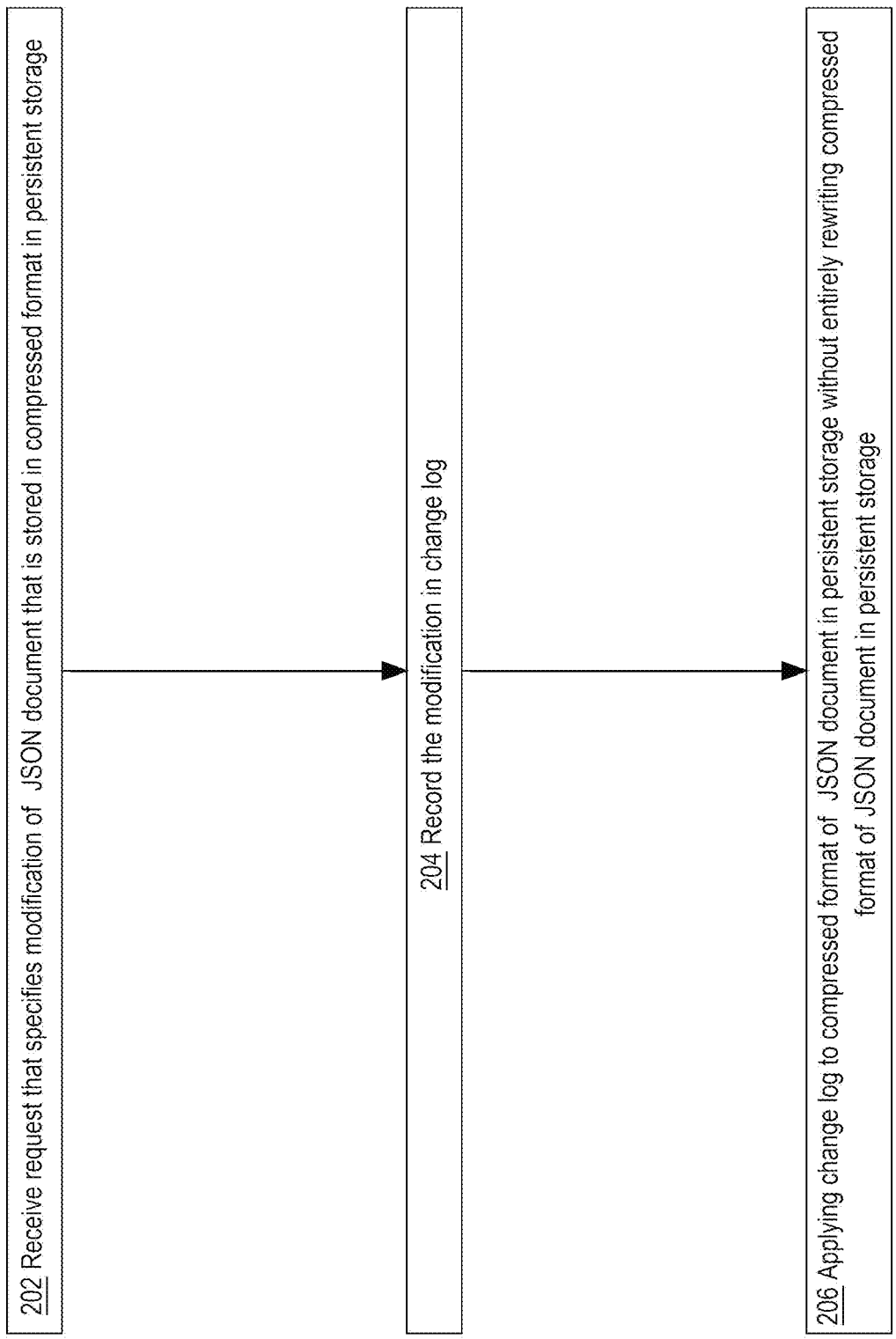
FIG. 2 is a flow diagram that depicts an example computer process to accelerate modification of a persistent JSON document by avoiding entirely rewriting the persistent JSON document.

FIG. 2 is a flow diagram that depicts an example process that computer 100 may perform to accelerate modification of JSON document 130 that is stored in compressed format 120 in persistent storage 110 by avoiding entirely rewriting compressed format 120 in the persistent storage 110. FIG. 2 is discussed with reference to FIG. 1.

Step 202 receives a request, such as 151 or 152, to modify JSON document 130. Example formats, semantics, and transports of requests 151-152 are presented earlier herein. For example, computer 100 may generate or receive request 151 on a socket for network or inter-process communication (IPC) such as with a message queue, shared memory, or an operating system (OS) pipe.

For example, modification 161 may specify replacement of old value 140 in JSON document 130 with new value 180 that is not a same size as old value 140. For example, new value 180 may be represented by more or fewer bytes than old value 140. Sizes of values may depend on encoding, especially binary encoding such as follows.

For example, text values "123" and "0.3" contain a same amount of characters but may have different sizes when encoded as strongly typed numbers in binary. For example, one number may encode as an integer, and another number may encode as floating point. Likewise, different integers may encode with different widths such as different amounts of bytes or machine words. Thus, standard JSON text encoding may or may not be indicative of value sizes in compressed format 120.

Other semantic encodings may include datatypes such as time, date, and Boolean. For example, "true" may encode as a single bit or byte or short, all of which are smaller than text. Dictionary encoding or run length encoding (RLE) are compressions that may affect value sizes. Character encodings such as ASCII or Unicode may affect value sizes. String representation by express length or null terminator may affect value sizes.

In another example, modification 162 specifies adding additional content 190 to JSON document 130. For example, modification 162 may cause insertion or appending of a new array element or a new JSON object field as discussed earlier herein. In any case, step 204 records details of modification 161 and/or 162, such as new value 180 and/or additional content 190, in change log 170. Recording techniques for change log 170 are discussed later herein.

Eventually, step 206 applies change log 170 to compressed format 120 of JSON document 130 in persistent storage 110 without entirely rewriting compressed format 120 of JSON document 130 in persistent storage 110. Writing techniques for compressed format 120 in persistent storage 110 based on change log 170 are discussed later herein.

3.0 Applying Change Log

Figure 3:
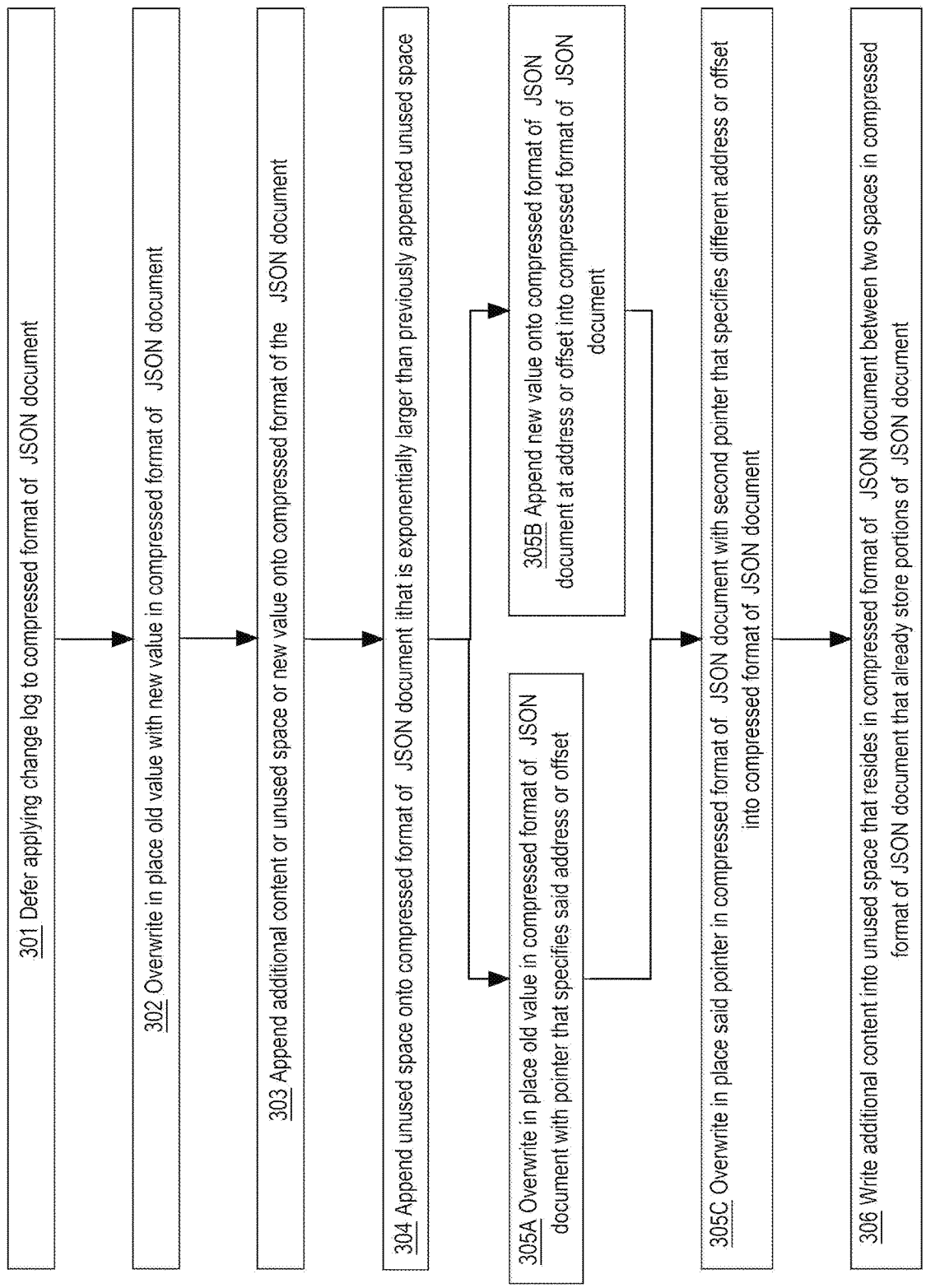
FIG. 3 is a flow diagram that depicts an example computer process to apply a change log to a compressed format of a JSON document and avoid entirely rewriting the compressed format.

FIG. 3 is a flow diagram that depicts an example process that computer 100 may perform to apply change log 170 to JSON document 130 that is stored in compressed format 120 in persistent storage 110 to avoid entirely rewriting compressed format 120 in the persistent storage 130. FIG. 3 is discussed with reference to FIG. 1.

As explained earlier herein, modifications 161-162 may be specified by a same request instead of separate requests 151-152 as previously shown. For demonstration, FIG. 3 entails processing a complex request that specifies modifications 161-162 and other modifications. Although the request makes many modifications, various steps of FIG. 3 may be respectively performed for one, some, or all modifications of the request. Thus, requests specifying fewer modifications may perform fewer steps of FIG. 3. Whether a particular step is or is not performed may depend on the example.

Depending on the scenario, there may be various reasons to defer actually writing modifications to compressed format 120 of JSON document 130 in persistent storage 110. For example, an ACID transaction needs isolation in which modification(s) by one client should not be visible to other clients until the transaction commits. In other examples, deferred writing to persistent storage 110 increases throughput.

For example, deferred writing may facilitate coalescing (i.e. combining) multiple modifications into a single modification. Likewise, deferred writing may decrease storage latency by reducing track seeking or rotational latency such as by sorting modifications into an ordering that increases a size of a sequential write of many disk blocks. In an embodiment, reducing track seeking saves energy. When request processing such as OLTP occurs in the foreground, deferred writing may occur in the background such as at a lower priority and/or subject to preemption.

Those are reasons for step 301 to defer writing some or all of compressed format 120 of JSON document 130 in persistent storage 110. For example, step 301 may record modifications 161-162 into change log 170 for later applying to compressed format 120 of JSON document 130 in persistent storage 110. Depending on the embodiment, such as when JSON document 130 is encapsulated with a document object model (DOM) and regardless of whether or not persistent writing is deferred, modifications 161-162 may be immediately: a) applied to a copy of JSON document 130 in volatile memory in a same format as compressed format 120 or in a different format such as text, and/or b) recorded in change log 170 in volatile or nonvolatile storage.

Eventually change log 170 should be applied to compressed format 120 of JSON document 130 in persistent storage 110, at which time change log 170 may have accumulated many unapplied modifications to JSON document 130 from same or different requests in a same transaction. Steps 302-306 show activities that may respectively occur to apply various modifications to compressed format 120 of JSON document 130 in persistent storage 110. For example, step 302 may be repeated for each of many modifications, and each of those modifications may or may not be processed by other steps in FIG. 2.

Depending on the scenario or embodiment, fulfilling modification 161 may entail physically overwriting old value 140 with new value 180 in place in compressed format 120 of JSON document 130 in persistent storage 110 during step 302, such as when new value 180 does not have a larger size than old value 140. For example, string truncation may entail reducing an express length or setting a character to null.

Likewise, array truncation may entail reducing an express length or setting an array element to null or storing a tombstone value that indicates deletion. Likewise, JSON object truncation may entail setting a field to null or the tombstone value. Tombstones are discussed later herein.

Step 303 demonstrates appending various objects onto compressed format 120 of JSON document 130 in persistent storage 110, and which object is appended may depend on the scenario as follows. Any of additional content 190, new value 180, or unused space for future use may be appended.

In an embodiment and regardless of whether additional content 190 adds an element to an existing aggregate or new value 180 replaces an existing aggregate element such as old value 140, the modification may entail copy on write for the whole aggregate. For example, step 303 may apply a modification of an aggregate to compressed format 120 of JSON document 130 in persistent storage 110 by appending a copy of the aggregate that reflects the modification onto compressed format 120 of JSON document 130 in persistent storage 110. Such relocation of previous content is further discussed later herein. In an embodiment, persistent storage 110 is append only (i.e. write once).

Upon various triggers, step 303 may append unused space onto JSON document 130 that is reserved for growth and is or is not reserved for a particular aggregate. In an embodiment, an aggregate has a linked list of segments such that: a) each segment has a pointer or offset to a next segment, and b) the aggregate can reactively and/or proactively grow a new empty segment such as according to an autonomous lifecycle of compressed format 120 of JSON document 130 in persistent storage 110 such as discussed later herein. In an embodiment, segments of a same aggregate have a same size such as bytes or capacity to store a same amount of elements.

There is a risk that unused space within compressed format 120 of JSON document 130 in persistent storage 110 may never be needed in which case the unused space is wasted. Wasted space may be avoided by appending unused space that is small. However, sometimes growth of JSON document 130 actually needs much space.

If much unused space is needed but provided in small segments, then many segments are needed which may incur much allocation latency such as due to repeated I/O and or system calls, both of which have high latency. Thus, there may be performance tension between: a) latency for adding many small segments, and b) wasted space for instead adding a big segment. Step 304 balances those design forces by appending segments of increasing size for a same aggregate. In an embodiment, the sizes increase exponentially.

A tombstone is a marker that overwrites a stale value in place. Thus, the tombstone should not have a larger size than the stale value. In an embodiment, there are two kinds of tombstones: deletion tombstones and redirection tombstones.

If the value is stale due to deletion, then a deletion tombstone need only be recognizable. Otherwise, the value is stale due to reassignment such as when the stale value is old value 140 that is replaced by new value 180 especially when old value 140 and new value 180 have different sizes such that a perfect overwriting in place of old value 140 by new value 180 is impossible. In that case, old value 140 may instead be overwritten in place with a redirection tombstone that contains a pointer or offset to new value 180 during step 305A.

Thus, what address or offset is new value 180 appended at within compressed format 120 of JSON document 130 in persistent storage 110 during step 305B should be available to step 305A that writes the pointer. The value of the pointer as an address or offset may be calculated before steps 305A-B. Thus in an embodiment, steps 305A-B occur in parallel as shown. In an embodiment, steps 305A-B instead occur sequentially such as when steps 305A-B write different sectors in a same cluster of sectors in a same disk track to reduce track seeking. In other words, at least steps 305A-B may be consolidated into a same single I/O write.

As explained above, step 305A overwrites old value 140 in place with a redirection tombstone. In an embodiment, change log 170 is fully truncated after being fully applied, and subsequent modifications to JSON document 130 may be subsequently appended onto change log 170. Thus, change log 170 may experience repeated flushing that entails applying and then truncating change log 170.

Any such flushing presents a barrier across which coalescing of modifications before writing do not occur. For example before flushing, modifications of respective adjacent elements of an aggregate may be coalesced. Modifications that arise after the flushing are not coalesced with modifications that have already been flushed.

In an embodiment, redirection tombstones may provide pointers for a linked list that daisy chains progressive revisions/reassignments of values of a same data item such as scalar or aggregate such that reading the linked list to find a current value of that same data item may entail linearly reading the redirection tombstones to traverse the entire linked list. In an embodiment, instead current value retrieval in constant time is provided by not daisy chaining nor retaining multiple redirection tombstones for the same data item because step 305C overwrites in place a previous redirection tombstone with a new redirection tombstone.

In an embodiment, a redirection tombstone is not sized larger than a deletion tombstone such that a deletion tombstone may overwrite in place a redirection tombstone. In an embodiment, a deletion tombstone is not sized larger than a redirection tombstone such that a redirection tombstone may overwrite in place a deletion tombstone. In an embodiment, both kinds of tombstones have a same size such that both kinds of tombstones may overwrite in place the other kind of tombstone.

In an embodiment, a single bit in a tombstone of both kinds indicates that the tombstone is a tombstone. In an embodiment, another single bit indicates that the tombstone is a deletion tombstone or a redirection tombstone.

Compressed format 120 of JSON document 130 in persistent storage 110 may be somewhat sparse with hole(s) of unused bytes in various places. For example, an aggregate (e.g. array) may store some elements but have unused internal space for more elements. Instead of increasing the size of JSON document 130, step 306 may instead infill additional content 190 or new value 180 into unused space of an already stored aggregate.

For example, steps 303-304 as explained above may append unused space onto compressed format 120 of JSON document 130 in persistent storage 110 that is reserved for a particular aggregate. When an unrelated value is later appended onto compressed format 120 of JSON document 130 in persistent storage 110, the previously appended unused space may become a hole that may be located between two unrelated values within compressed format 120 of JSON document 130 in persistent storage 110.

Step 306 may infill a hole with an element of an aggregate such as when the hole has unused space that is reserved for the aggregate. Thus, growth of an aggregate need not cause growth of compressed format 120 of JSON document 130 in persistent storage 110. For example, it may be faster to write into an existing hole than to allocate and write into a new space.

4.0 Autonomous Lifecycles of Components

Figure 4:
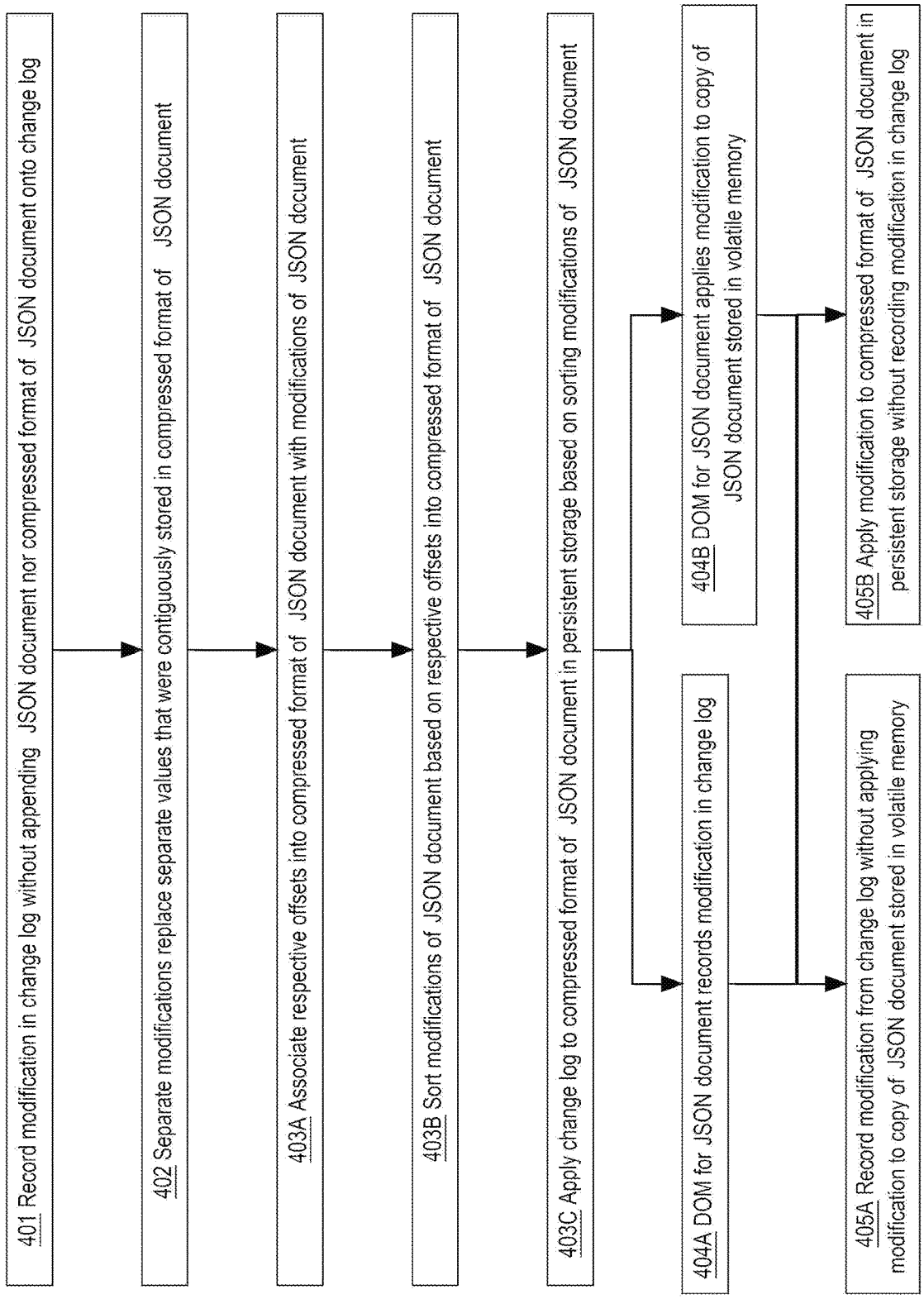
FIG. 4 is a flow diagram that depicts an example computer process to administer the lifecycle of a change log for a compressed format of a JSON document.

FIG. 4 is a flow diagram that depicts an example process that computer 100 may perform to administer the lifecycle of change log 170 for compressed format 120 of JSON document 130. FIG. 4 is discussed with reference to FIG. 1.

Modifications 161-162 may be limited in scope such that most of JSON document 130 is unaffected by modifications 161-162. In an embodiment, modification 161 or 162 is appended onto change log 170 as a command according to the command software design pattern. For example, change log 170 may store change commands that each specifies a portion of JSON document 130 such as a field to add, reassign, or delete and/or new scalar or aggregate value(s) for the portion.

For example, change log 170 may reside in volatile buffer(s) and/or a volatile or nonvolatile queue such as a file such that latest changes are appended onto one end of the queue, and a change is eventually physically applied to compressed format 120 of JSON document 130 in persistent storage 110 in first in first out (FIFO) order when the change reaches the other end of the queue and is removed from the queue. Instead of appending revised JSON document 130 or compressed format 120 of JSON document 130 in their entirety, step 401 appends only the change command or other change representation onto change log 170. Thus, change log 170 is a dense specification of accumulated pending changes that are represented as change commands that are applied to compressed format 120 of JSON document 130 in persistent storage 110 when dequeued.

Change log 170 may have its own lifecycle that includes transitions such as accumulating modifications and flushing by applying modifications to compressed format 120 of JSON document 130 in persistent storage 110. Accumulating and flushing may be decoupled. For example, flushing may occur in the background upon autonomous triggers and entail autonomously decided activities. In other words, change log 170 may have its own autonomous lifecycle that may at times be more or less independent of client requests to modify JSON document 130.

For example, two values may be contiguous such as aggregate elements in compressed format 120 of JSON document 130 in persistent storage 110. As explained earlier herein, modifications of contiguously stored values may be coalesced into a single modification such as during step 402. For example when a modification is appended onto change log 170, the modification may immediately be coalesced with another modification that change log 170 already contains.

Because change log 170 has an autonomous lifecycle, such eager coalescing may be unneeded. For example, change log 170 may have its own computational thread that coalesces changes in change log 170 at any time in the background or immediately before change log 170 is applied to compressed format 120 of JSON document 130 in persistent storage 110.

In an embodiment, change log 170 is available to a standby database for high availability (HA) by replication such as for failover from a primary database to the standby database. For example, de-queueing a change from the change log may entail applying the change to the primary database and sending the same change to another computer to eventually be applied to the standby database.

Background coalescing of modifications of contiguously stored elements is an example of autonomous activity by change log 170. Even when elements are not contiguous, modifications of those elements may be written to different sectors in a same cluster of sectors in a same disk track to reduce track seeking, which may entail steps 403A-403C for contiguously or non-contiguously stored elements.

Step 403A associates one or two offsets with each modification, such as when each modification is appended onto change log 170, which may facilitate coalescing and clustering as follows. Offset(s) of a modification may be included in the modification in change log 170, such as an offset of old value 140 and/or an offset of new value 180.

Steps 403B-C may autonomously occur at a later time that need not be related to step 403A such as in the background. Step 403B sorts modifications based on the storage offsets of their new values. With modifications sorted, clustering and/or identifying modifications for coalescing is straightforward.

Such sorting may occur: a) incrementally such as according to a sorted insertion as each modification is logged such that change log 170 is always sorted such as when change log 170 is a priority queue, b) in the background such as not during a demand spike such that change log 170 may autonomously change from unsorted to sorted, or c) just in time when change log 170 is eventually applied to compressed format 120 of JSON document 130 in persistent storage 110. Regardless of how and when change log 170 is sorted, step 403C applies change log 170 to compressed format 120 of JSON document 130 in persistent storage 110 based on the sorting.

As explained earlier herein, a DOM may encapsulate JSON document 130 to provide a convenient application programing interface (API) for clients. Depending on the embodiment, the DOM may be integrated with: change log 170, compressed format 120 of JSON document 130 in persistent storage 110, and/or a representation of JSON document 130 in volatile memory that may or may not be the same as compressed format 120. For example, the DOM may detect whether or not JSON document 130 is cached in volatile memory.

Depending on the embodiment, the DOM may itself be stateful and/or have its own autonomous lifecycle such as with a background thread and/or asynchronous triggers. Steps 404-405 demonstrate activities that the DOM may autonomously decide to perform or not.

The DOM may concurrently perform steps 404A-B as shown such as in fulfilment of a same modification. Step 404A records the modification in change log 170. Step 404B applies the same modification to a representation of JSON document 130 in volatile memory that may or may not be the same as compressed format 120.

Steps 405A-B are mutually exclusive. For acceleration during step 405A, the DOM may record a modification in change log 170 without applying the modification to the representation of JSON document 130 in volatile memory. For example, the DOM may invalidate the representation of JSON document 130 in volatile memory.

At times such as when a database connection is configured to automatically and individually commit each data manipulation language (DML) statement such as SQL in its own transaction, the DOM may bypass or otherwise operate without change log 170. Step 405B applies a modification to compressed format 120 of JSON document 130 in persistent storage 110 without recording the modification in change log 170.

Compressed format 120 of JSON document 130 in persistent storage 110 may also have its own autonomous lifecycle that may at times be more or less independent of change log 170, the DOM, and client requests. For example when free disk space falls below a threshold, computer 100 may autonomously compact compressed format 120 of JSON document 130 in persistent storage 110 to reduce the size of compressed format 120 of JSON document 130 in persistent storage 110. For example, holes with unused space may be removed, and/or tombstones may be replaced with actual values. Such compaction may entail entirely rewriting compressed format 120 of JSON document 130 in persistent storage 110.

5.0 Database Configurations

Figure 5:
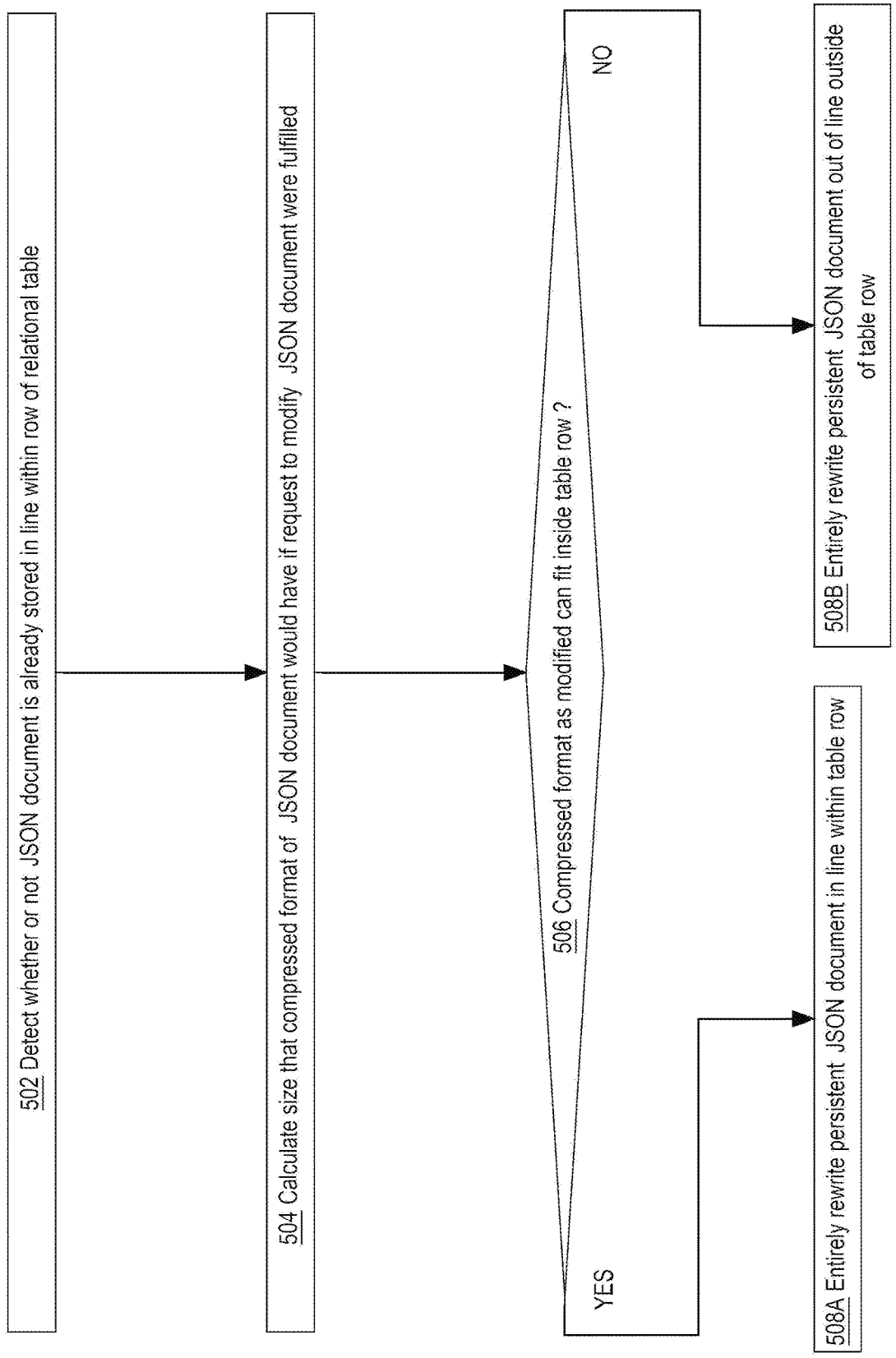
FIG. 5 is a flow diagram that depicts an example computer process to store a compressed format of a JSON document in a relational table of a database.

Before presenting FIG. 5, the following database discussion demonstrates database configurability that may or may not be needed for database integration. As discussed earlier herein, persistent storage 110 may contain a relational database that contains compressed format 120 of JSON document 130. The following Table 1 enumerates example database configurations 801-804, some or all of which computer 100 may implement.

| Database Configuration | Meaning |
| --- | --- |
| 801 | Request to modify persistent JSON document is SQL statement |
| 802 | Persistent JSON document is stored in relational table |
| 803 | Persistent JSON document is stored in LOB column of relational table |
| 804 | Persistent JSON document is stored out of line outside row of relational table |

Compressed format 120 of JSON document 130 may be stored in a database in persistent storage 110 and/or volatile memory. For example, computer 100 may host a database management system (DBMS) that contains a database that contains compressed format 120 of JSON document 130. In database configuration 801, requests 151-152 are SQL statements such as UPDATE. In a predicate and/or an assignment, a SQL statement may include an expression language such as JSON, a subset of JavaScript, extensible markup language (XML) path (XPath), or a regular expression. The expression language may navigate, select, filter, and/or assign content within one or many persistent JSON documents such as compressed format 120 of JSON document 130.

DBMSs herein may be polyglot with a JSON expression language embedded into a native DML language such as SQL. A Turing complete example JSON expression language that is embedded within SQL for finding, navigating, reading, and writing sets and portions of JSON documents stored in relational tables is presented in related U.S. patent application Ser. No. 16/703,499. Sufficient integration of JSON into SQL is provided by the SQL:2016 standard and related non-patent literature (NPL) "Technical Report ISO/IEC TR 19075-6", both of which define and standardize built in functions that convert JSON into relational data or otherwise access JSON data from SQL, including functions such as JSON TABLE and JSON EXISTS as explained therein.

In database configuration 802, compressed format 120 of JSON document 130 is stored in a relational table in the database. In an embodiment, the relational table may contain zero or more persistent JSON documents in each table row such as in respective columns.

In database configuration 803, compressed format 120 of JSON document 130 is stored as a large object (LOB) in a column of the relational table. The encoding of the LOB may or may not depend on the datatype of the column. A LOB may be a binary LOB (BLOB) or character LOB (CLOB). LOBs are discussed later herein.

In database configuration 804, JSON document 130 is stored out of line for a row of the relational table, which is outside of the row itself. For example, the relational table may contain a column that is stored separately from other columns of the same relational table. In an embodiment and regardless of whether the relational table has row major or column major storage: a) all columns are stored in database blocks, b) many columns of the same relational table are stored in a same database block for same or different table rows, except c) the JSON column and/or compressed format 120 of JSON document 130 are stored in separate database block(s). In an embodiment, the JSON column and/or compressed format 120 of JSON document 130 are stored in a separate file.

6.0 Database Integration

FIG. 5 is a flow diagram that depicts an example process that computer 100 may perform to store compressed format 120 of JSON document 130 in a relational table of a database. FIG. 5 is discussed with reference to FIG. 1.

As discussed earlier herein, compressed format 120 of JSON document 130 may be stored inline with other columns inside a row of a relational table such as by row major format in volatile and/or nonvolatile storage. Compressed format 120 of JSON document 130 may instead be stored out of line outside of the table row. Inline storage may provide accelerated access and increase efficiency by increasing data locality.

However, inline storage may be capacity limited and accommodated as follows. Step 502 detects whether or not compressed format 120 of JSON document 130 is already stored inline within a row of a relational table. For example, a relational schema may indicate that some JSON columns always are or are not stored inline. In an embodiment, some rows store a same JSON column inline and other rows of the same JSON column do not.

In an embodiment, each row contains its own metadata that indicates whether or not the JSON column is stored inline. In embodiments, that indication metadata is stored in header metadata of the row or contiguous to an inline persistent JSON document. In an embodiment, that indication metadata is a single bit that is stored inline or stored in a bitmap for multiple rows.

Step 504 calculates a size that compressed format 120 of JSON document 130 would have if a current request to modify JSON document 130 were fulfilled. In other words, a new increased or decreased size for compressed format 120 of JSON document 130 is calculated during execution of the modification request.

According to step 506, steps 508A-B are mutually exclusive. When step 506 detects that the new size of compressed format 120 of JSON document 130 is small enough to inline compressed format 120 of JSON document 130, then the table row itself provides storage for the write request. If compressed format 120 of JSON document 130 is already inlined, then in some scenarios a partial update in place may occur. In other scenarios, step 508A entirely rewrites compressed format 120 of JSON document 130 inline regardless of whether or not compressed format 120 of JSON document 130 was or was not already inlined.

Regardless of overwriting in place or appending, inlining need not always cause entirely rewriting such as for compaction. For example, a redirection tombstone that points elsewhere inline within the space of the table row may occur. However, inlining is more likely to cause compaction because of overflow.

Overflow occurs when compressed format 120 of JSON document 130 is already inlined but the table row has insufficient capacity to accommodate a current write request. In some cases, compaction inline may resolve overflow. In some cases overflow is resolved by moving only a part of compressed format 120 of JSON document 130 to outside of the table row. For example, a redirection tombstone in compressed format 120 of JSON document 130 may reside inline but point out of line outside of the table row after overflow is resolved. In an embodiment, even a table row as initially inserted contains a redirection tombstone when JSON document 130 is too large for inlining. Otherwise, step 508B entirely rewrites JSON document 130 out of line outside of the table row.

As discussed earlier herein, compressed format 120 of JSON document 130 and its DOM may have autonomous lifecycles. For example autonomously or not, computer 100 may detect that compaction of compressed format 120 of JSON document 130 that is already stored outside of the table row would save enough space to fit compressed format 120 of JSON document 130 inline within the table row. In that case, step 508A occurs, and compressed format 120 of JSON document 130 or its DOM autonomously deallocate the out of line storage that is no longer needed due to inlining.

In an embodiment, the DOM is integrated with a LOB API that manages storage of LOBs outside of table rows. In an embodiment, change log 170 contains change commands that are respective invocations of the LOB API such as described later herein.

7.0 Rewrite Thresholds

As discussed earlier herein, JSON document 130 may be wrapped by a DOM that can switch between alternate storages of compressed format 120 of JSON document 130 such as with tiered storage such as with a memory cache. In an embodiment, the DOM fulfils read requests by accessing storage tiers in the following order: 1) change log 170, 2) a cache, and 3) persistent storage 110. For example, a request to read two fields may be fulfilled by reading one field from change log 170 and reading the other field by: a) detecting that JSON document 130 is not cached such as with a cache miss, and b) reading some or all of compressed format 120 of JSON document 130 in persistent storage 110.

Partial updates to compressed format 120 of JSON document 130 may invalidate previous values and/or over allocate unneeded space within compressed format 120 of JSON document 130. In any case, compressed format 120 of JSON document 130 may accumulate hole(s) of wasted space that may reduce efficiency.

Regardless of whether or not space is wasted, multiple partial updates to same or different JSON fields adds level(s) of indirection to field access through redirection tombstones and/or change log 170, which reduces efficiency because traversing pointers adds computation and latency, especially if a critical path of operation reads change log 170. Complications such as indirection or reading a change log are examples of data storage fragmentation that may reduce efficiency in some scenarios.

In an embodiment, fragmentation is reduced or eliminated by applying change log 170 and/or compacting JSON document 130 in volatile and/or nonvolatile storage. Compacting entails partially or entirely rewriting compressed format 120 of JSON document 130 more or less as if writing an original version of a new JSON document in compressed format 120. Partial or entire rewriting may occur in place by overwriting. Compacting may or may not occur according to an autonomous lifecycle of a component such as compressed format 120 of JSON document 130, its DOM, or change log 170.

Entire rewriting may instead occur by logically copying compressed format 120 of JSON document 130 that for some portions of compressed format 120 need not make an exact physical copy. For example, multiple values within compressed format 120 of JSON document 130 that were not contiguously stored may become contiguously stored by logical copying. In an embodiment, fields within JSON objects may be reordered during copying.

In some embodiments, compaction unconditionally occurs at some lifecycle transitions of compressed format 120 of JSON document 130, either autonomously or not. For example, some scenarios of archiving or online analytical processing (OLAP) should be preceded by compaction. Online transaction processing (OLTP) may compact when a transaction is committed. Copying or moving compressed format 120 of JSON document 130 from a faster storage tier to a slower storage tier such as during a cache write back may cause compaction.

Compaction of compressed format 120 of JSON document 130 may occur when any of various rewrite thresholds are crossed. For example, sometimes a read, write, or either for compressed format 120 of JSON document 130 may cause immediate or deferred compaction in the background or foreground depending on the embodiment or scenario. In an embodiment, numeric thresholds are manually tunable, automatically optimizable, and/or trainable by machine learning (ML). In any case, a threshold setting should avoid extremes of compacting too frequently or infrequently. In an embodiment, compaction is a cost based decision. The performance cost of compacting may be amortized across many future accesses of compressed format 120 of JSON document 130 and may more or less depend on forecasting future accesses.

The following Table 2 enumerates example rewrite thresholds 811-815 that trigger compaction, some or all of which computer 100 may implement.

| Rewrite Threshold | Meaning |
| --- | --- |
| 811 | Ratio of size of content appended onto persistent JSON document to size of persistent JSON document |
| 812 | Amount of bytes or storage blocks appended onto persistent JSON document without entirely rewriting the persistent JSON document |
| 813 | Amount of requests to modify persistent JSON document that were fulfilled without entirely rewriting persistent JSON document |
| 814 | Amount of requests to modify persistent JSON document that increased size of persistent JSON document without entirely rewriting persistent JSON document |
| 815 | Duration elapsed, without entirely rewriting persistent JSON document, since size of persistent JSON document was last increased |

In an embodiment, compressed format 120 of JSON document 130 has a last compact size that is an amount of bytes or data blocks that compressed format 120 of JSON document 130 had when last compacted or originally populated. Likewise, an accumulated additional size is an amount of content appended onto compressed format 120 of JSON document 130 since the last compact size occurred. Rewrite threshold 811 may be a ratio or difference between the last compact size and the accumulated additional size.

In an embodiment and regardless of last compact size or ratio or difference, the accumulated additional size is by itself compared to rewrite threshold 812. An embodiment may have multiple rewrite thresholds, such as some or all of 811-815. In an embodiment, compaction occurs when any one rewrite threshold is crossed. In an embodiment, an additional threshold specifies how many different rewrite thresholds must be simultaneously exceeded to cause compaction.

Rewrite threshold 813 is compared to an amount of write requests for compressed format 120 of JSON document 130 since the last compact size occurred, regardless of how many bytes for each write request and regardless of whether writes occurred in place or by appending. Rewrite threshold 814 only counts such write requests that: a) increased the size of JSON document 130, or b) entailed appending. In some embodiments or scenarios, (a) and (b) are equivalent conditions that occur together.

Rewrite threshold 815 checks a duration elapsed since the size of compressed format 120 of JSON document 130 first increased, or last increased, after the last compact size occurred. Depending on the embodiment, temporal durations may be checked when accessing compressed format 120 of JSON document 130 or by background timer.

Accounting that occurs for many, most, or all rewrite thresholds is reset when compressed format 120 of JSON document 130 is compacted. Each persistent JSON document is separately accounted for each rewrite threshold such that each persistent JSON document is separately triggered for compaction.

8.0 Exemplary Embodiment

The following exemplary embodiment may be based on embodiments presented earlier herein. This exemplary embodiment demonstrates example implementation choices. Requirements of this exemplary embodiment are not necessarily requirements for embodiments presented earlier herein.

Included in this exemplary embodiment is OSON, an efficient and optimized binary format for JSON documents as presented in related U.S. Pat. No. 10,262,012. OSON may occur in volatile and/or nonvolatile storage and/or in transmission such as in a communication network. OSON may be wrapped by a DOM API as discussed earlier herein.

Included in this exemplary embodiment is a relational DBMS (RDBMS) such as Oracle. The RDBMS may provide: a) row major and/or column major storage of relational tables in volatile and/or nonvolatile storage, b) volatile cache and/or buffer management such as with in memory compression units (IMCUs), c) atomic consistent isolated durable (ACID) transactions, d) SQL including JSON or JavaScript expressions, e) LOB storage inline or out of line for a table row, and/or f) indexing of tabular and/or JSON content. For example, a relational join may correlate a scalar column in one table with a scalar field in JSON documents in a JSON column of another table. Integration of JSON, SQL, and IMCUs within an RDBMS is presented in related U.S. patent application Ser. No. 16/904,417.

8.1 SQL/JSON Query Compiler Support

The included RDBMS contains a query compiler that supports JSON_TRANSFORM( ) with a LOB ASSIGNMENT operator as follows. The following is an example DML update query, and table JSON_COLLECTION has a JSON type column JCOL. The update query updates the JSON_COLLECTION table to assign a value into the JCOL column.

UPDATE JSON_COLLECTION SET JCOL=JSON_TRANSFORM(JCOL, SET '$.person.friends[3]'='John Smith')

An UPDATE statement may change data values in one or more columns, usually based on specific criteria. The following is an example predicate for a JSON column such as JCOL.

'$.person.friends[3]'='John Smith'

During a SQL compilation phase, a LOB ASSIGMENT operator is created to copy the shortcut ($) to a 'person' object with a 'friend' property, and the third element of the array property has its identified friend property set to 'John Smith'.

During the SQL compilation phase, the LOB ASSIGMENT operator is created to copy the right hand side (RHS) of an assignment (in this case it computes the result of JSON_TRANSFORM( ), into the left hand side (LHS) of the assignment which is a persistent JSON column in which to do full JSON document replacement. The SQL Compiler detects this case and may cause a partial OSON update during run time because the JSON type input to JSON_TRANSFORM( ) is the same JSON column to be updated on the LHS side, so the compiler adds additional flags and an offset into the meta data structure of the LOB ASSIGNMENT operator to indicate that the RHS result shall be handled specially during run time for the partial OSON update situation. The JSON_TRANSFORM( ) operator meta data structure is annotated with corresponding flags and same offset so that it can communicate its update status on a per document basis during run time to its parent LOB ASSIGMENT operator.

8.2 SQL/JSON JSON_TRANSFORM( ) Run Time Evaluation with LOB ASSIGNMENT Operator

During run time, when JSON_TRANSFORM( ) is being evaluated, if the partial update flag is set, then JSON_TRANSFORM( ) examines the input to the JSON type column. If the input JSON column OSON document size is small enough, such as with a BLOB inline case, then functional evaluation loads an in-memory mutable DOM from OSON bytes to facilitate the JSON transform engine using the DOM query and update API directly on the in-memory DOM. After that, the in-memory mutated DOM is encoded into OSON bytes as a return value of JSON_TRANSFORM( ).

After that, the LOB ASSIGNMENT directly copies the OSON bytes to do full replacement on the left side JSON column. OSON bytes loading into in-memory mutable DOM is fast because it maps an OSON field name dictionary directly into an in-memory DOM field name hash table without deep copying of OSON leaf scalar values. Thus, JSON in-memory DOM leaf scalar content directly points into OSON bytes. In-memory DOM update of a leaf scalar value may be performed in OSON in place or by copy on write.

When OSON bytes overflow the inline capacity of the JSON column then out of line is used for the JSON document, in which case the JSON transform engine still calls the same DOM API to do query and update, however, this time the DOM API delegates to the underlying OSON DOM instead of in-memory JSON DOM. The DOM API that performs update actions over OSON may perform a partial update on the OSON bytes. Upon finishing the transformation, no new OSON bytes are returned from JSON_TRANSFORM( ) and instead JSON_TRANSFORM( ) uses the offset shared with the LOB ASSIGMENT operator to point to a memory location that records the completion status of the partial update together with a pointer to a data structure that captures the partial OSON update entry in an update log.

When the LOB ASSIGMENT operator is evaluated, it dereferences according to the offset, which is shared with JSON_TRANSFORM( ) to get content to detect if a partial OSON update has occurred instead of entirely rewriting. If a partial update occurred, then a BLOB length-preserved update or append API is called based on the partial OSON update log structures. Otherwise, full replacement is done by using results from JSON_TRANSFORM( )

8.3 Partial OSON Update Log

OSON DOM partial update API implementation performs the actual update on the input OSON bytes that are copied into a modifiable buffer and meanwhile produces an OSON partial update log as a sequence of partial update log entries. There are two kinds of update log entry:
  A. length-preserved replacement: specifies the starting offset to make length-preserved update and the length of the new replacement bytes. The actual new OSON bytes are already written in the modifiable buffer, and
  B. append bytes: all the new bytes that need to be appended in the end of the current OSON document is copied into one appending buffer.

When JSON_TRANSFORM( ) finishes, it calls OSON DOM to finalize the OSON update log. The OSON length-preserved replacement update log entries are consolidated by sorting their offsets and merging all the contiguous pieces. That reduces an actual number of calls to replace bytes in OSON. Ideally with such coalescing, there is one combined append bytes call.

8.4 Autonomously Switch to Full OSON Update if Accumulated Updates for Append are Too Large If during the OSON DOM partial update operation, a total appending bytes will exceed 25% of the original OSON document size, then OSON update log entry tracking ceases. Instead when request execution is finished, new OSON bytes are generated that reflect the final updated documents, and the new OSON bytes are returned as a return value of JSON_TRANSFORM( ) so that the calling LOB ASSIGMENT operator can do full document replacement.

8.5 OSON Byte Code Change to Support Partial OSON Update

OSON is extended with a new operation code (opcode) to indicate JSON node content is not in place but rather is at a forward address to a new offset where the updated content is stored such as with a redirection tombstone.

For object and array new elements insertion, OSON partial update may preallocate children in the object or array in an amount that is a power of two. This requires adding another new opcode UPD_XSZ_RES that indicates the node has extra space reserved for growth. If the JSON tree node header is UPD_XSZ_RES, then its next byte encodes a size of the extra space reserved for growth for this node. The size is encoded as a power of two, so one byte is enough. Following the space size byte may be a usual opcode.

8.6 Client Side OSON Decoder

A client side OSON decoder is enhanced to handle OSON that has gone through partial update(s). Client interfaces to the binary image expose the logical document (current state) and end users are not directly aware any of partial updates that may have occurred. Additional client techniques for OSON are presented in related U.S. patent application Ser. No. 16/904,417.

These techniques may be forensically detectable as the explain plan for json_transform( ) will show the partial OSON update optimization, and there is run time statistics tracking for how many partial updates were done during run time.

Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 6:
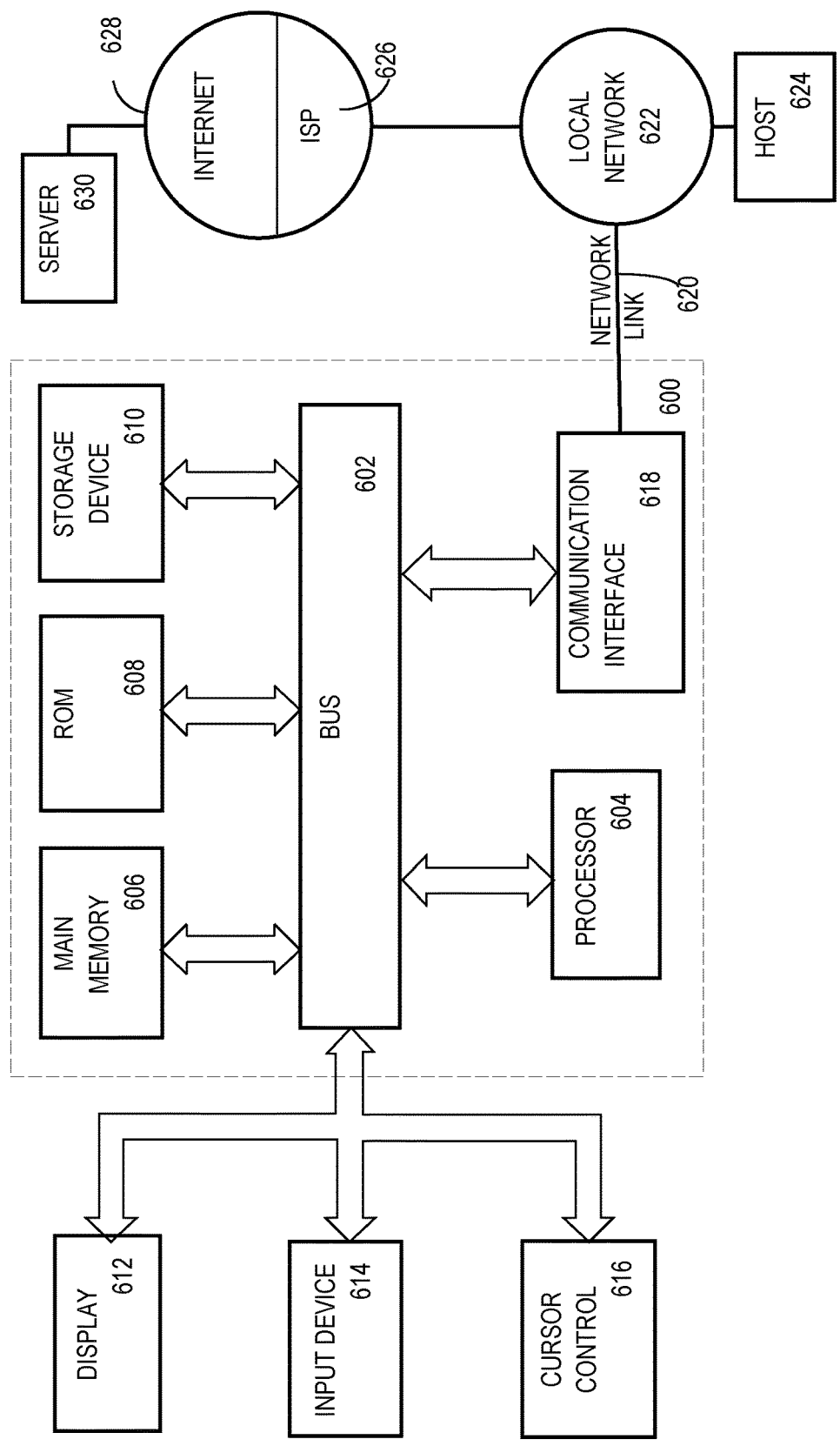
FIG. 6 is a block diagram that illustrates a computer system upon which an embodiment of the invention may be implemented.

For example, FIG. 6 is a block diagram that illustrates a computer system 600 upon which an embodiment of the invention may be implemented. Computer system 600 includes a bus 602 or other communication mechanism for communicating information, and a hardware processor 604 coupled with bus 602 for processing information. Hardware processor 604 may be, for example, a general purpose microprocessor.

Computer system 600 also includes a main memory 606, such as a random access memory (RAM) or other dynamic storage device, coupled to bus 602 for storing information and instructions to be executed by processor 604. Main memory 606 also may be used for storing temporary variables or other intermediate information during execution of instructions to be executed by processor 604. Such instructions, when stored in non-transitory storage media accessible to processor 604, render computer system 600 into a special-purpose machine that is customized to perform the operations specified in the instructions.

Computer system 600 further includes a read only memory (ROM) 608 or other static storage device coupled to bus 602 for storing static information and instructions for processor 604. A storage device 610, such as a magnetic disk, optical disk, or solid-state drive is provided and coupled to bus 602 for storing information and instructions.

Computer system 600 may be coupled via bus 602 to a display 612, such as a cathode ray tube (CRT), for displaying information to a computer user. An input device 614, including alphanumeric and other keys, is coupled to bus 602 for communicating information and command selections to processor 604. Another type of user input device is cursor control 616, such as a mouse, a trackball, or cursor direction keys for communicating direction information and command selections to processor 604 and for controlling cursor movement on display 612. This input device typically has two degrees of freedom in two axes, a first axis (e.g., x) and a second axis (e.g., y), that allows the device to specify positions in a plane.

Computer system 600 may implement the techniques described herein using customized hard-wired logic, one or more ASICs or FPGAs, firmware and/or program logic which in combination with the computer system causes or programs computer system 600 to be a special-purpose machine. According to one embodiment, the techniques herein are performed by computer system 600 in response to processor 604 executing one or more sequences of one or more instructions contained in main memory 606. Such instructions may be read into main memory 606 from another storage medium, such as storage device 610. Execution of the sequences of instructions contained in main memory 606 causes processor 604 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical disks, magnetic disks, or solid-state drives, such as storage device 610. Volatile media includes dynamic memory, such as main memory 606. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 602. Transmission media can also take the form of acoustic or light waves, such as those generated during radio-wave and infra-red data communications.

Various forms of media may be involved in carrying one or more sequences of one or more instructions to processor 604 for execution. For example, the instructions may initially be carried on a magnetic disk or solid-state drive of a remote computer. The remote computer can load the instructions into its dynamic memory and send the instructions over a telephone line using a modem. A modem local to computer system 600 can receive the data on the telephone line and use an infra-red transmitter to convert the data to an infra-red signal. An infra-red detector can receive the data carried in the infra-red signal and appropriate circuitry can place the data on bus 602. Bus 602 carries the data to main memory 606, from which processor 604 retrieves and executes the instructions. The instructions received by main memory 606 may optionally be stored on storage device 610 either before or after execution by processor 604.

Computer system 600 also includes a communication interface 618 coupled to bus 602. Communication interface 618 provides a two-way data communication coupling to a network link 620 that is connected to a local network 622. For example, communication interface 618 may be an integrated services digital network (ISDN) card, cable modem, satellite modem, or a modem to provide a data communication connection to a corresponding type of telephone line. As another example, communication interface 618 may be a local area network (LAN) card to provide a data communication connection to a compatible LAN. Wireless links may also be implemented. In any such implementation, communication interface 618 sends and receives electrical, electromagnetic or optical signals that carry digital data streams representing various types of information.

Network link 620 typically provides data communication through one or more networks to other data devices. For example, network link 620 may provide a connection through local network 622 to a host computer 624 or to data equipment operated by an Internet Service Provider (ISP) 626. ISP 626 in turn provides data communication services through the world wide packet data communication network now commonly referred to as the "Internet" 628. Local network 622 and Internet 628 both use electrical, electro-magnetic or optical signals that carry digital data streams. The signals through the various networks and the signals on network link 620 and through communication interface 618, which carry the digital data to and from computer system 600, are example forms of transmission media.

Computer system 600 can send messages and receive data, including program code, through the network(s), network link 620 and communication interface 618. In the Internet example, a server 630 might transmit a requested code for an application program through Internet 628, ISP 626, local network 622 and communication interface 618.

The received code may be executed by processor 604 as it is received, and/or stored in storage device 610, or other non-volatile storage for later execution.

Software Overview

Figure 7:
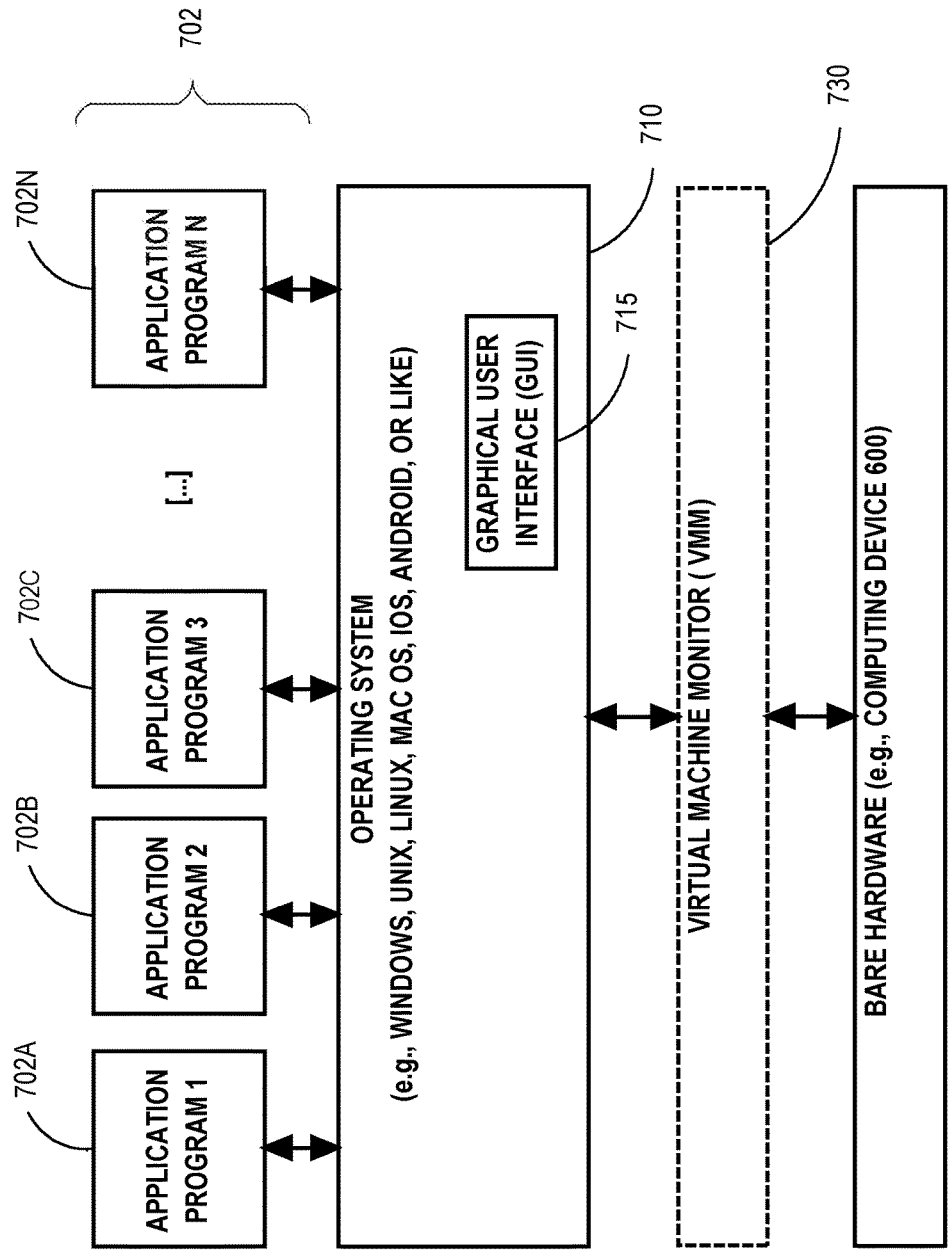
FIG. 7 is a block diagram that illustrates a basic software system that may be employed for controlling the operation of a computing system.

FIG. 7 is a block diagram of a basic software system 700 that may be employed for controlling the operation of computing system 600. Software system 700 and its components, including their connections, relationships, and functions, is meant to be exemplary only, and not meant to limit implementations of the example embodiment(s). Other software systems suitable for implementing the example embodiment(s) may have different components, including components with different connections, relationships, and functions.

Software system 700 is provided for directing the operation of computing system 600. Software system 700, which may be stored in system memory (RAM) 606 and on fixed storage (e.g., hard disk or flash memory) 610, includes a kernel or operating system (OS) 710.

The OS 710 manages low-level aspects of computer operation, including managing execution of processes, memory allocation, file input and output (I/O), and device I/O. One or more application programs, represented as 702A, 702B, 702C . . . 702N, may be "loaded" (e.g., transferred from fixed storage 610 into memory 606) for execution by the system 700. The applications or other software intended for use on computer system 600 may also be stored as a set of downloadable computer-executable instructions, for example, for downloading and installation from an Internet location (e.g., a Web server, an app store, or other online service).

Software system 700 includes a graphical user interface (GUI) 715, for receiving user commands and data in a graphical (e.g., "point-and-click" or "touch gesture") fashion. These inputs, in turn, may be acted upon by the system 700 in accordance with instructions from operating system 710 and/or application(s) 702. The GUI 715 also serves to display the results of operation from the OS 710 and application(s) 702, whereupon the user may supply additional inputs or terminate the session (e.g., log off).

OS 710 can execute directly on the bare hardware 720 (e.g., processor(s) 604) of computer system 600. Alternatively, a hypervisor or virtual machine monitor (VMM) 730 may be interposed between the bare hardware 720 and the OS 710. In this configuration, VMM 730 acts as a software "cushion" or virtualization layer between the OS 710 and the bare hardware 720 of the computer system 600.

VMM 730 instantiates and runs one or more virtual machine instances ("guest machines"). Each guest machine comprises a "guest" operating system, such as OS 710, and one or more applications, such as application(s) 702, designed to execute on the guest operating system. The VMM 730 presents the guest operating systems with a virtual operating platform and manages the execution of the guest operating systems.

In some instances, the VMM 730 may allow a guest operating system to run as if it is running on the bare hardware 720 of computer system 700 directly. In these instances, the same version of the guest operating system configured to execute on the bare hardware 720 directly may also execute on VMM 730 without modification or reconfiguration. In other words, VMM 730 may provide full hardware and CPU virtualization to a guest operating system in some instances.

In other instances, a guest operating system may be specially designed or configured to execute on VMM 730 for efficiency. In these instances, the guest operating system is "aware" that it executes on a virtual machine monitor. In other words, VMM 730 may provide para-virtualization to a guest operating system in some instances.

A computer system process comprises an allotment of hardware processor time, and an allotment of memory (physical and/or virtual), the allotment of memory being for storing instructions executed by the hardware processor, for storing data generated by the hardware processor executing the instructions, and/or for storing the hardware processor state (e.g. content of registers) between allotments of the hardware processor time when the computer system process is not running. Computer system processes run under the control of an operating system, and may run under the control of other programs being executed on the computer system.

Cloud Computing

The term "cloud computing" is generally used herein to describe a computing model which enables on-demand access to a shared pool of computing resources, such as computer networks, servers, software applications, and services, and which allows for rapid provisioning and release of resources with minimal management effort or service provider interaction.

A cloud computing environment (sometimes referred to as a cloud environment, or a cloud) can be implemented in a variety of different ways to best suit different requirements. For example, in a public cloud environment, the underlying computing infrastructure is owned by an organization that makes its cloud services available to other organizations or to the general public. In contrast, a private cloud environment is generally intended solely for use by, or within, a single organization. A community cloud is intended to be shared by several organizations within a community; while a hybrid cloud comprise two or more types of cloud (e.g., private, community, or public) that are bound together by data and application portability.

Generally, a cloud computing model enables some of those responsibilities which previously may have been provided by an organization's own information technology department, to instead be delivered as service layers within a cloud environment, for use by consumers (either within or external to the organization, according to the cloud's public/private nature). Depending on the particular implementation, the precise definition of components or features provided by or within each cloud service layer can vary, but common examples include: Software as a Service (SaaS), in which consumers use software applications that are running upon a cloud infrastructure, while a SaaS provider manages or controls the underlying cloud infrastructure and applications. Platform as a Service (PaaS), in which consumers can use software programming languages and development tools supported by a PaaS provider to develop, deploy, and otherwise control their own applications, while the PaaS provider manages or controls other aspects of the cloud environment (i.e., everything below the run-time execution environment). Infrastructure as a Service (IaaS), in which consumers can deploy and run arbitrary software applications, and/or provision processing, storage, networks, and other fundamental computing resources, while an IaaS provider manages or controls the underlying physical cloud infrastructure (i.e., everything below the operating system layer). Database as a Service (DBaaS) in which consumers use a database server or Database Management System that is running upon a cloud infrastructure, while a DbaaS provider manages or controls the underlying cloud infrastructure and applications.

The above-described basic computer hardware and software and cloud computing environment presented for purpose of illustrating the basic underlying computer components that may be employed for implementing the example embodiment(s). The example embodiment(s), however, are not necessarily limited to any particular computing environment or computing device configuration. Instead, the example embodiment(s) may be implemented in any type of system architecture or processing environment that one skilled in the art, in light of this disclosure, would understand as capable of supporting the features and functions of the example embodiment(s) presented herein.

Database Overview

Embodiments of the present invention are used in the context of database management systems (DBMSs). Therefore, a description of an example DBMS is provided.

Generally, a server, such as a database server, is a combination of integrated software components and an allocation of computational resources, such as memory, a node, and processes on the node for executing the integrated software components, where the combination of the software and computational resources are dedicated to providing a particular type of function on behalf of clients of the server. A database server governs and facilitates access to a particular database, processing requests by clients to access the database.

Users interact with a database server of a DBMS by submitting to the database server commands that cause the database server to perform operations on data stored in a database. A user may be one or more applications running on a client computer that interact with a database server. Multiple users may also be referred to herein collectively as a user.

Database Dictionary

A database comprises data and a database dictionary that is stored on a persistent memory mechanism, such as a set of hard disks. A database is defined by its own separate database dictionary. A database dictionary may comprise multiple data structures that store database metadata. A database dictionary may for example, comprise multiple files and tables. Portions of the data structures may be cached in main memory of a database server.

A database dictionary comprises metadata that defines database objects contained in a database. In effect, a database dictionary defines much of a database. When a database object is said to be defined by a database dictionary, the database dictionary contains metadata that defines properties of the database object. For example, metadata in a database dictionary defining a database table may specify the column names and datatypes of the columns, and one or more files or portions thereof that store data for the table. Metadata in the database dictionary defining a procedure may specify a name of the procedure, the procedure's arguments and the return datatype and the datatypes of the arguments, and may include source code and a compiled version thereof.

Database objects include tables, table columns, and tablespaces. A tablespace is a set of one or more files that are used to store the data for various types of database objects, such as a table. If data for a database object is stored in a tablespace, a database dictionary maps a database object to one or more tablespaces that hold the data for the database object.

A database object may be defined by the database dictionary, but the metadata in the database dictionary itself may only partly specify the properties of the database object. Other properties may be defined by data structures that may not be considered part of the database dictionary. For example, a user defined function implemented in a JAVA class may be defined in part by the database dictionary by specifying the name of the users defined function and by specifying a reference to a file containing the source code of the Java class (i.e., java file) and the compiled version of the class (i.e., class file).

Database Operation

A database dictionary is referred to by a DBMS to determine how to execute database commands submitted to a DBMS. Database commands can access the database objects that are defined by the dictionary. A database command may be in the form of a database statement. For the database server to process the database statements, the database statements must conform to a database language supported by the database server. One non-limiting example of a database language that is supported by many database servers is SQL, including proprietary forms of SQL supported by such database servers as Oracle, (e.g. Oracle Database 11g). SQL data definition language ("DDL") instructions are issued to a database server to create or configure database objects, such as tables, views, or complex types. Data manipulation language ("DML") instructions are issued to a DBMS to manage data stored within a database structure. For instance, SELECT, INSERT, UPDATE, and DELETE are common examples of DML instructions found in some SQL implementations. SQL/WL is a common extension of SQL used when manipulating XML data in an object-relational database.

A multi-node database management system is made up of interconnected nodes that share access to the same database. Typically, the nodes are interconnected via a network and share access, in varying degrees, to shared storage, e.g. shared access to a set of disk drives and data blocks stored thereon. The nodes in a multi-node database system may be in the form of a group of computers (e.g. work stations, personal computers) that are interconnected via a network. Alternately, the nodes may be the nodes of a grid, which is composed of nodes in the form of server blades interconnected with other server blades on a rack.

Each node in a multi-node database system hosts a database server. A server, such as a database server, is a combination of integrated software components and an allocation of computational resources, such as memory, a node, and processes on the node for executing the integrated software components on a processor, the combination of the software and computational resources being dedicated to performing a particular function on behalf of one or more clients.

Resources from multiple nodes in a multi-node database system can be allocated to running a particular database server's software. Each combination of the software and allocation of resources from a node is a server that is referred to herein as a "server instance" or "instance". A database server may comprise multiple database instances, some or all of which are running on separate computers, including separate server blades.

Query Processing

A query is an expression, command, or set of commands that, when executed, causes a server to perform one or more operations on a set of data. A query may specify source data object(s), such as table(s), column(s), view(s), or snapshot(s), from which result set(s) are to be determined. For example, the source data object(s) may appear in a FROM clause of a Structured Query Language ("SQL") query. SQL is a well-known example language for querying database objects. As used herein, the term "query" is used to refer to any form of representing a query, including a query in the form of a database statement and any data structure used for internal query representation. The term "table" refers to any source object that is referenced or defined by a query and that represents a set of rows, such as a database table, view, or an inline query block, such as an inline view or subquery.

The query may perform operations on data from the source data object(s) on a row by-row basis as the object(s) are loaded or on the entire source data object(s) after the object(s) have been loaded. A result set generated by some operation(s) may be made available to other operation(s), and, in this manner, the result set may be filtered out or narrowed based on some criteria, and/or joined or combined with other result set(s) and/or other source data object(s).

A subquery is a portion or component of a query that is distinct from other portion(s) or component(s) of the query and that may be evaluated separately (i.e., as a separate query) from the other portion(s) or component(s) of the query. The other portion(s) or component(s) of the query may form an outer query, which may or may not include other subqueries. A subquery nested in the outer query may be separately evaluated one or more times while a result is computed for the outer query.

Generally, a query parser receives a query statement and generates an internal query representation of the query statement. Typically, the internal query representation is a set of interlinked data structures that represent various components and structures of a query statement.

The internal query representation may be in the form of a graph of nodes, each interlinked data structure corresponding to a node and to a component of the represented query statement. The internal representation is typically generated in memory for evaluation, manipulation, and transformation.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A method comprising:
    receiving a request that specifies a modification of a JavaScript object notation (JSON) document that is stored in a compressed format in persistent storage, wherein the modification comprises at least one selected from the group consisting of:
        additional content to add to the JSON document, and
        a new value that is not a same size as an old value to be replaced in the JSON document;

recording the modification in a change log;
applying the change log to the compressed format of the JSON document in the persistent storage without entirely rewriting the compressed format of the JSON document in the persistent storage.

2. The method of claim 1 wherein said applying the change log to the compressed format of the JSON document comprises appending, onto the compressed format of the JSON document in the persistent storage, one selected from the group consisting of: the additional content, a second unused space, and the new value.

3. The method of claim 2 further comprising appending a second unused space onto the compressed format of the JSON document in the persistent storage that is exponentially larger than said unused space.

4. The method of claim 2 wherein:
said appending the new value onto the compressed format of the JSON document in the persistent storage occurs at an address or offset into the compressed format of the JSON document in the persistent storage;
said applying the change log to the compressed format of the JSON document comprises overwriting in place said old value in the compressed format of the JSON document in the persistent storage with a pointer that specifies said address or offset.

5. The method of claim 4 further comprising overwriting in place said pointer in the compressed format of the JSON document in the persistent storage with a second pointer that specifies a different address or offset into the compressed format of the JSON document in the persistent storage.

6. The method of claim 1 further comprising applying the modification to a copy of the JSON document that is stored in volatile memory.

7. The method of claim 6 wherein a document object model (DOM) of the JSON document performs:
said recording the modification in the change log, and
said applying the modification to the copy of the JSON document that is stored in the volatile memory.

8. The method of claim 7 wherein:
a second modification of said JSON document is specified by one selected from the group consisting of said request that specifies the modification of the JSON document and a second request;
the method further comprises said DOM of the JSON document recording the second modification in the change log without applying the second modification to the copy of the JSON document that is stored in the volatile memory.

9. The method of claim 7 wherein:
a second modification of said JSON document is specified by one selected from the group consisting of said request that specifies the modification of the JSON document and a second request;
the method further comprises said DOM of the JSON document applying the second modification to the compressed format of the JSON document in the persistent storage without said recording the second modification in the change log.

10. The method of claim 1 wherein said applying the change log to the compressed format of the JSON document comprises
overwriting in place the old value with the new value in the compressed format of the JSON document.

11. The method of claim 1 further comprising coalescing said modification and a second modification into a single combined modification that replaces, in the change log, at least one selected from the group consisting of said modification and said second modification in the change log.

12. The method of claim 11 wherein said modification and said second modification replace separate values that were contiguously stored in the compressed format of the JSON document in the persistent storage before said applying the change log to the compressed format of the JSON document in the persistent storage.

13. The method of claim 1 wherein:
the method further comprises:
associating respective offsets into the compressed format of the JSON document with a plurality of modifications of the JSON document that includes said modification of the JSON document; and
sorting said plurality of modifications of the JSON document based on said respective offsets into the compressed format of the JSON document;
said applying the change log to the compressed format of the JSON document in the persistent storage is based on said sorting said plurality of modifications of the JSON document.

14. The method of claim 1 wherein said recording the modification in the change log does not comprise appending the JSON document nor the compressed format of the JSON document onto the change log.

15. The method of claim 1 wherein at least one selected from the group consisting of:
the compressed format of the JSON document is stored in a relational table, and
the request that specifies the modification of the JSON document is a structured query language (SQL) statement.

16. The method of claim 15 wherein at least one selected from the group consisting of:
the compressed format of the JSON document is stored out of line outside a row of the relational table, and
the compressed format of the JSON document is stored in a large object (LOB) column of the relational table.

17. The method of claim 1 further comprising entirely rewriting the compressed format of the JSON document in the persistent storage when a threshold is exceeded by one selected from the group consisting of:
a ratio of a size of a plurality of contents appended onto the compressed format of the JSON document in the persistent storage to a size of the compressed format of the JSON document in the persistent storage, and
an amount of bytes or storage blocks appended onto the compressed format of the JSON document in the persistent storage without entirely rewriting the compressed format of the JSON document in the persistent storage.

18. The method of claim 1 further comprising:
detecting, for a second request to modify a second JSON document that is stored in a compressed format in the persistent storage, that the compressed format of the second JSON document is already stored in line within a row of a relational table;
calculating a size that the compressed format of the second JSON document would have if the second request to modify the second JSON document were fulfilled;
deciding, based on said size, whether to entirely rewrite the compressed format of the second JSON document in the persistent storage in one selected from the group consisting of:
in line within said row, and
out of line outside of said row.

19. The method of claim 1 performed without using a schema of the JSON document.

20. The method of claim 1 further comprising deferring said applying the change log to the compressed format of the JSON document.

21. The method of claim 1 wherein said applying the change log to the compressed format of the JSON document comprises writing the additional content into an unused space that resides in the compressed format of the JSON document in the persistent storage between two spaces in the compressed format of the JSON document in the persistent storage that already store portions of the JSON document.

22. One or more non-transitory computer-readable media storing instructions that, when executed by one or more processors, cause:
receiving a request that specifies a modification of a JavaScript object notation (JSON) document that is stored in a compressed format in persistent storage, wherein the modification comprises at least one selected from the group consisting of:
additional content to add to the JSON document, and
a new value that is not a same size as an old value to be replaced in the JSON document;
recording the modification in a change log;
applying the change log to the compressed format of the JSON document in the persistent storage without entirely rewriting the compressed format of the JSON document in the persistent storage.

23. The one or more non-transitory computer-readable media of claim 22 wherein the instructions, when executed by the one or more processors, further cause applying the modification to a copy of the JSON document that is stored in volatile memory.

24. The one or more non-transitory computer-readable media of claim 23 wherein a document object model (DOM) of the JSON document performs:
said recording the modification in the change log, and
said applying the modification to the copy of the JSON document that is stored in the volatile memory.

25. The one or more non-transitory computer-readable media of claim 24 wherein:
a second modification of said JSON document is specified by one selected from the group consisting of said request that specifies the modification of the JSON document and a second request;
the instructions, when executed by the one or more processors, further cause said DOM of the JSON document recording the second modification in the change log without applying the second modification to the copy of the JSON document that is stored in the volatile memory.

26. The one or more non-transitory computer-readable media of claim 22 wherein said applying the change log to the compressed format of the JSON document comprises appending, onto the compressed format of the JSON document in the persistent storage, one selected from the group consisting of: the additional content, a second unused space, and the new value.

27. The one or more non-transitory computer-readable media of claim 11 wherein the instructions, when executed by the one or more processors, further cause appending a second unused space onto the compressed format of the JSON document in the persistent storage that is exponentially larger than said unused space.

28. The one or more non-transitory computer-readable media of 26 wherein:
said appending the new value onto the compressed format of the JSON document in the persistent storage occurs at an address or offset into the compressed format of the JSON document in the persistent storage;
said applying the change log to the compressed format of the JSON document comprises overwriting in place said old value in the compressed format of the JSON document in the persistent storage with a pointer that specifies said address or offset.

29. The one or more non-transitory computer-readable media of claim 28 wherein the instructions, when executed by the one or more processors, further cause overwriting in place said pointer in the compressed format of the JSON document in the persistent storage with a second pointer that specifies a different address or offset into the compressed format of the JSON document in the persistent storage.

30. The one or more non-transitory computer-readable media of claim 22 wherein the instructions, when executed by the one or more processors, further cause appending, onto the compressed format of the JSON document in the persistent storage, one selected from the group consisting of: the additional content, a second unused space, and the new value.

31. The one or more non-transitory computer-readable media of claim 30 wherein said modification and a second modification replace separate values that were contiguously stored in the compressed format of the JSON document in the persistent storage before said applying the change log to the compressed format of the JSON document in the persistent storage.

32. The one or more non-transitory computer-readable media of claim 22 wherein:
the instructions, when executed by the one or more processors, further cause:
associating respective offsets into the compressed format of the JSON document with a plurality of modifications of the JSON document that includes said modification of the JSON document; and
sorting said plurality of modifications of the JSON document based on said respective offsets into the compressed format of the JSON document;
said applying the change log to the compressed format of the JSON document in the persistent storage is based on said sorting said plurality of modifications of the JSON document.

33. The one or more non-transitory computer-readable media of claim 22 wherein said recording the modification in the change log does not comprise appending the JSON document nor the compressed format of the JSON document onto the change log.

34. The one or more non-transitory computer-readable media of claim 22 wherein at least one selected from the group consisting of:
the compressed format of the JSON document is stored in a relational table, and the request that specifies the modification of the JSON document is a structured query language (SQL) statement.

35. The one or more non-transitory computer-readable media of claim 34 wherein at least one selected from the group consisting of:
the compressed format of the JSON document is stored out of line outside a row of the relational table, and
the compressed format of the JSON document is stored in a large object (LOB) column of the relational table.

36. The one or more non-transitory computer-readable media of claim 22 wherein the instructions, when executed by the one or more processors, further cause entirely rewriting the compressed format of the JSON document in the persistent storage when a threshold is exceeded by one selected from the group consisting of:
- a ratio of a size of a plurality of contents appended onto the compressed format of the JSON document in the persistent storage to a size of the compressed format of the JSON document in the persistent storage, and
- an amount of bytes or storage blocks appended onto the compressed format of the JSON document in the persistent storage without entirely rewriting the compressed format of the JSON document in the persistent storage.

37. The one or more non-transitory computer-readable media of claim 22 wherein the instructions, when executed by the one or more processors, further cause:
- detecting, for a second request to modify a second JSON document that is stored in a compressed format in the persistent storage, that the compressed format of the second JSON document is already stored in line within a row of a relational table;
- calculating a size that the compressed format of the second JSON document would have if the second request to modify the second JSON document were fulfilled;
- deciding, based on said size, whether to entirely rewrite the compressed format of the second JSON document in the persistent storage in one selected from the group consisting of:
  in line within said row, and
  out of line outside of said row.

* * * * *